US 7,288,973 B2

(12) United States Patent
Zerbe et al.

(10) Patent No.: US 7,288,973 B2
(45) Date of Patent: *Oct. 30, 2007

(54) METHOD AND APPARATUS FOR FAIL-SAFE RESYNCHRONIZATION WITH MINIMUM LATENCY

(75) Inventors: Jared LeVan Zerbe, Palo Alto, CA (US); Michael Tak-kei Ching, Sunnyvale, CA (US); Abhijit M. Abhyankar, Sunnyvale, CA (US); Richard M. Barth, Palo Alto, CA (US); Andy Peng-Pui Chan, San Jose, CA (US); Paul G. Davis, San Jose, CA (US); William F. Stonecypher, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 114 days.

This patent is subject to a terminal disclaimer.

(21) Appl. No.: 11/237,276

(22) Filed: Sep. 27, 2005

(65) Prior Publication Data

US 2006/0022724 A1   Feb. 2, 2006

Related U.S. Application Data

(63) Continuation of application No. 10/282,531, filed on Oct. 28, 2002, now Pat. No. 6,949,958, which is a continuation of application No. 09/169,372, filed on Oct. 9, 1998, now Pat. No. 6,473,439.

(60) Provisional application No. 60/061,505, filed on Oct. 10, 1997.

(51) Int. Cl.
*H03L 7/00* (2006.01)
(52) U.S. Cl. .................. 327/144; 327/141; 370/503
(58) Field of Classification Search ................ 327/141, 327/144, 154, 162, 163; 370/503
See application file for complete search history.

(56) References Cited

U.S. PATENT DOCUMENTS 4,819,081 A    4/1989   Volk et al. ..................... 327/12

(Continued)

FOREIGN PATENT DOCUMENTS

| WO | PCT/US98/21448 | 4/1993 |
| WO | WO93/18463 | 9/1993 |
| WO | WO96/41267 | 12/1996 |

OTHER PUBLICATIONS

Dennison, L.R., et al., "Low Latency Plesiochronous Data Retiming," Artificial Intelligence Laboratory, MIT, date unknown.
Messerschmitt, D.G., "Synchronization in Digital System Design," IEEE J. on Selected Areas in Communications, vol. 8, No. 8, Oct. 1990.

*Primary Examiner*—Kenneth B. Wells
*Assistant Examiner*—Hai L. Nguyen
(74) *Attorney, Agent, or Firm*—Morgan, Lewis & Bockius LLP

(57) ABSTRACT

A method and circuit for achieving minimum latency data transfer between two mesochronous (same frequency, different phase) clock domains is disclosed. This circuit supports arbitrary phase relationships between two clock domains and is tolerant of temperature and voltage shifts after initialization while maintaining the same output data latency. In one embodiment, this circuit is used on a bus-system to re-time data from receive-domain, clocks to transmit-domain clocks. In such a system the phase relationships between these two clocks is set by the device bus location and thus is not precisely known. By supporting arbitrary phase resynchronization, this disclosure allows for theoretically infinite bus-length and thus no limitation on device count, as well as arbitrary placement of devices along the bus. This ultimately allows support of multiple latency-domains for very long buses.

22 Claims, 25 Drawing Sheets

U.S. PATENT DOCUMENTS

| | | |
|---|---|---|
| 5,266,851 A | 11/1993 | Nukui ............................ 327/3 |
| 5,432,823 A | 7/1995 | Basbarro et al. ............. 375/356 |
| 5,504,742 A | 4/1996 | Kakuma et al. ............ 370/60.1 |
| 5,509,038 A | 4/1996 | Wicki ........................... 375/371 |
| 5,550,875 A | 8/1996 | Bennett ........................ 375/356 |
| 5,551,050 A | 8/1996 | Ehlig et al. .................. 395/800 |
| 5,646,519 A | 7/1997 | Hamilton et al. ......... 324/76.82 |
| 5,652,530 A | 7/1997 | Ashuri ............................ 326/93 |
| 5,757,868 A | 5/1998 | Kelton et al. ................ 375/360 |
| 5,799,048 A | 8/1998 | Farjad-Rad et al. ......... 375/360 |
| 5,909,473 A * | 6/1999 | Aoki et al. ................... 375/373 |
| 5,923,190 A | 7/1999 | Yamaguchi ................... 327/12 |
| 6,008,680 A | 12/1999 | Kyles et al. ................. 327/277 |
| 6,100,722 A | 8/2000 | Dalmia .......................... 327/12 |
| 6,150,889 A | 11/2000 | Gilliver et al. ................ 331/14 |
| 6,172,540 B1 * | 1/2001 | Gandhi ........................ 327/145 |
| 6,205,191 B1 | 3/2001 | Portmann et al. ............ 375/354 |
| 6,233,528 B1 | 5/2001 | Lai et al. ........................ 702/69 |
| 6,334,163 B1 * | 12/2001 | Dreps et al. ................. 710/260 |
| 6,473,439 B1 | 10/2002 | Zerbe et al. ................. 370/503 |
| 6,614,314 B2 | 9/2003 | d'Haene et al. ............. 331/1 A |
| 6,798,259 B2 | 9/2004 | Lin .............................. 327/153 |
| 6,799,280 B1 * | 9/2004 | Edenfield et al. ............ 713/400 |
| 6,949,958 B2 * | 9/2005 | Zerbe et al. ..................... 327/3 |
| 6,987,823 B1 * | 1/2006 | Stark et al. .................. 375/354 |

* cited by examiner

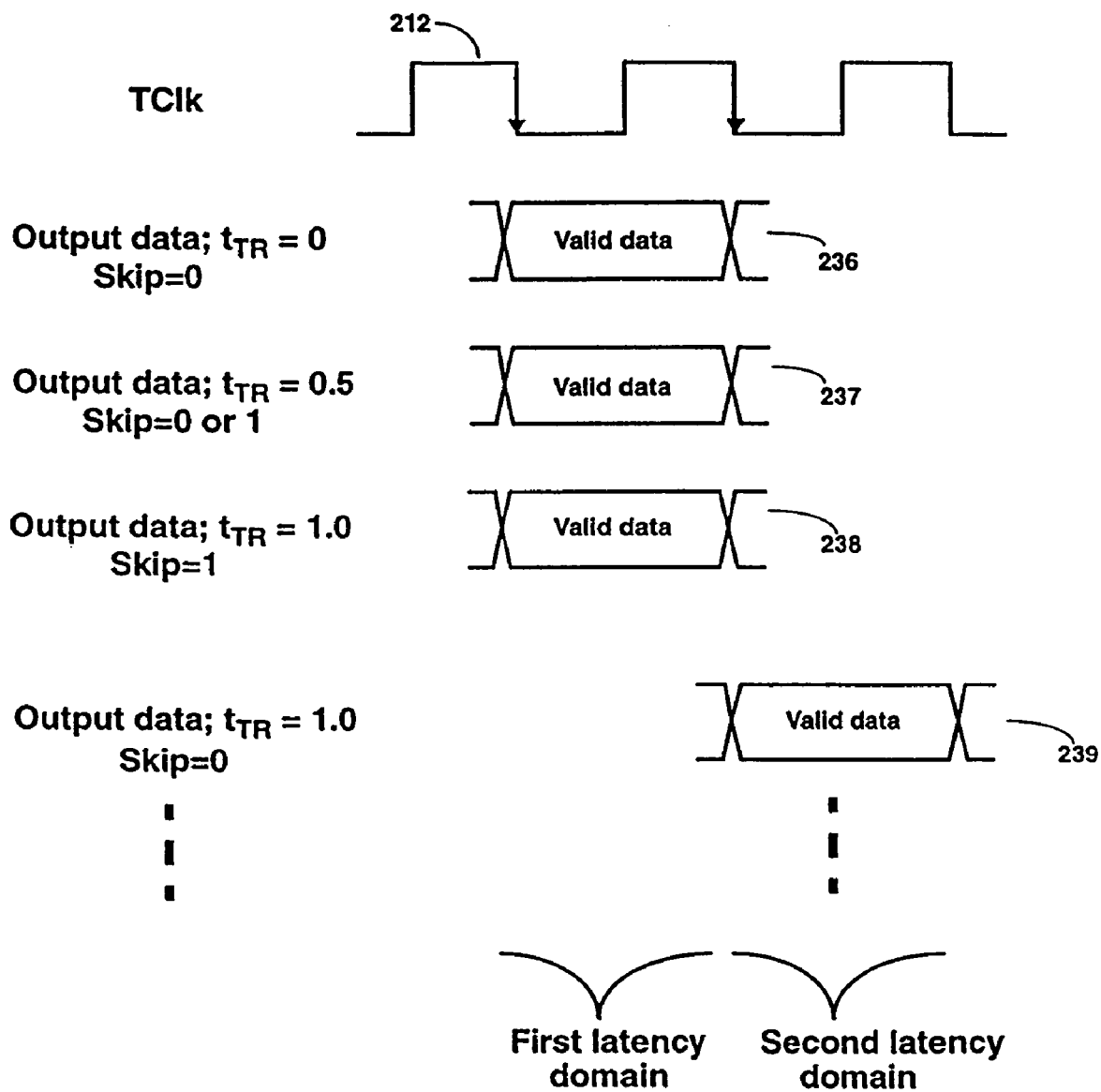
FIG_4

FIG_5
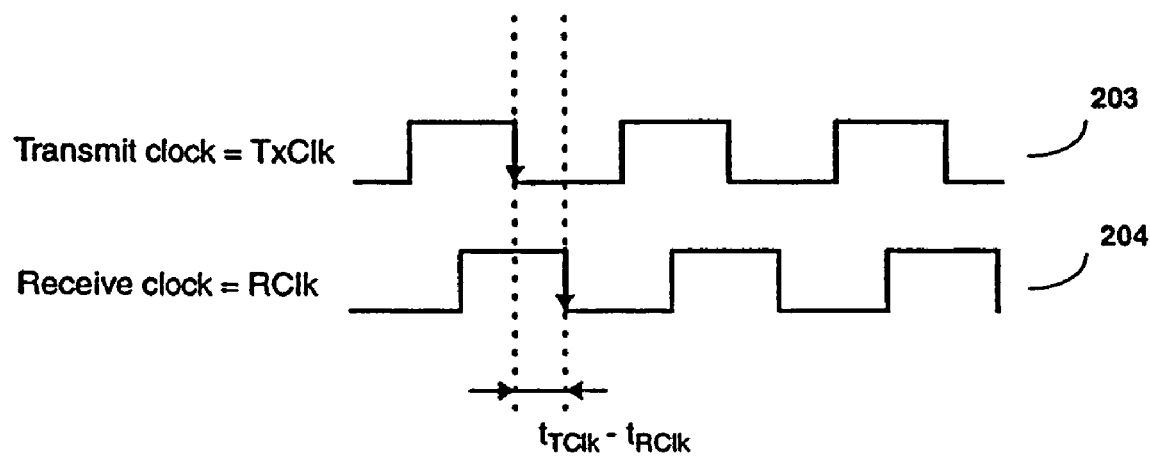
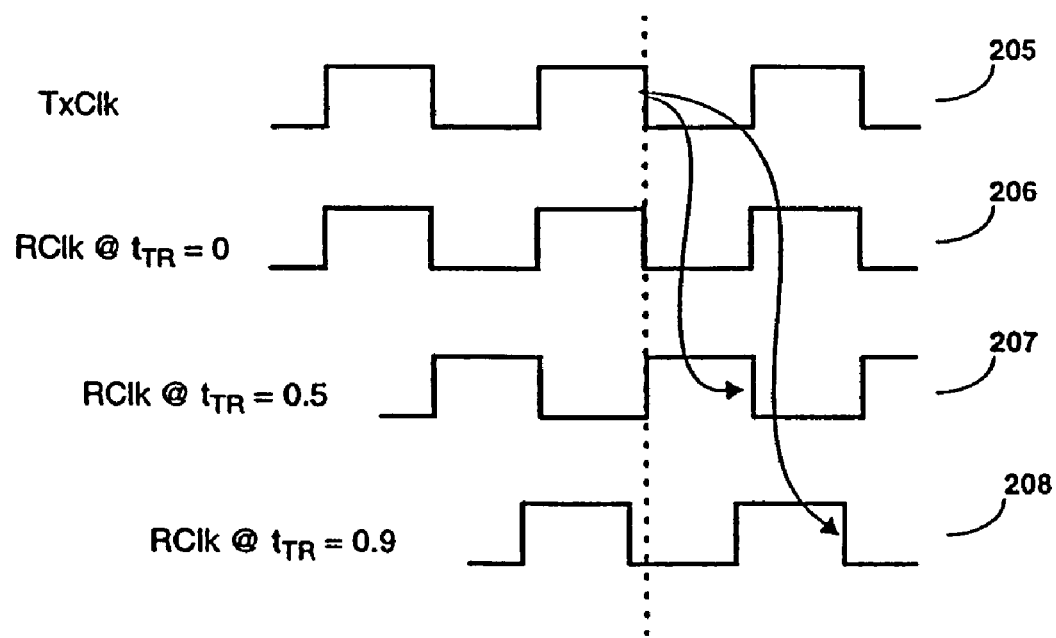

FIG_6
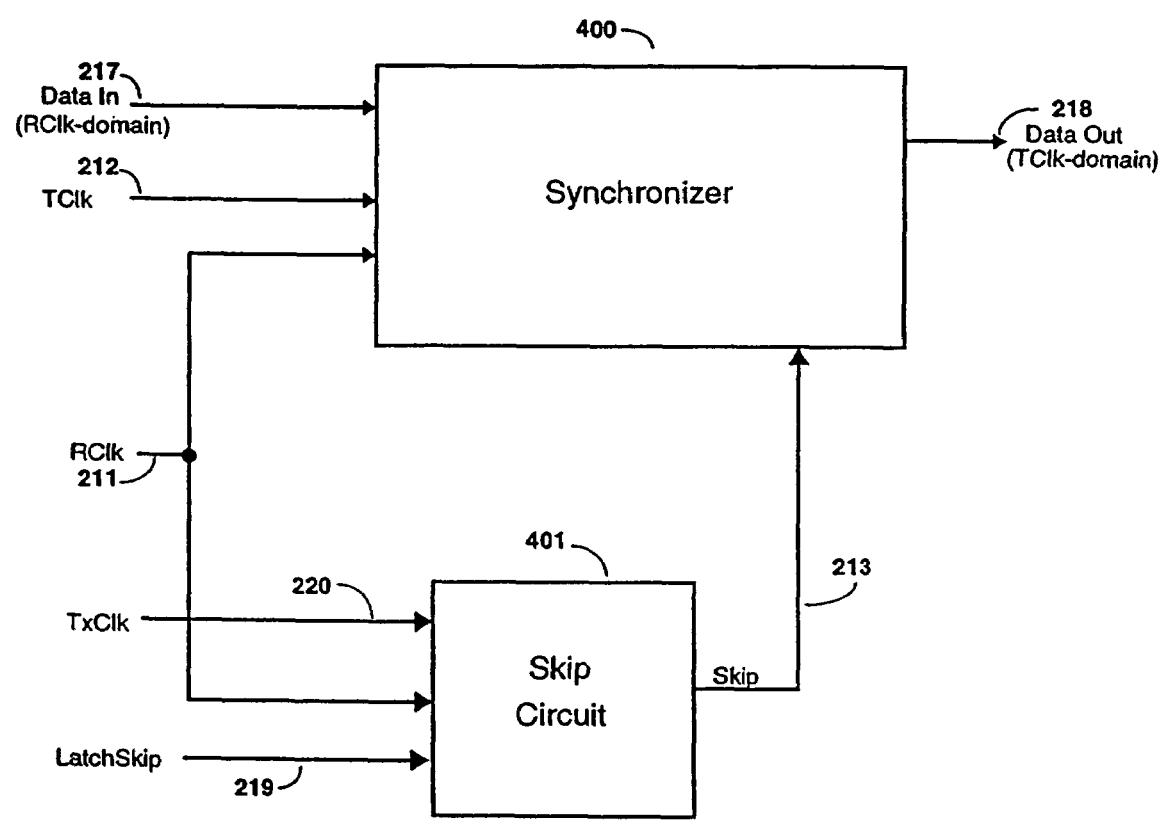

FIG_7
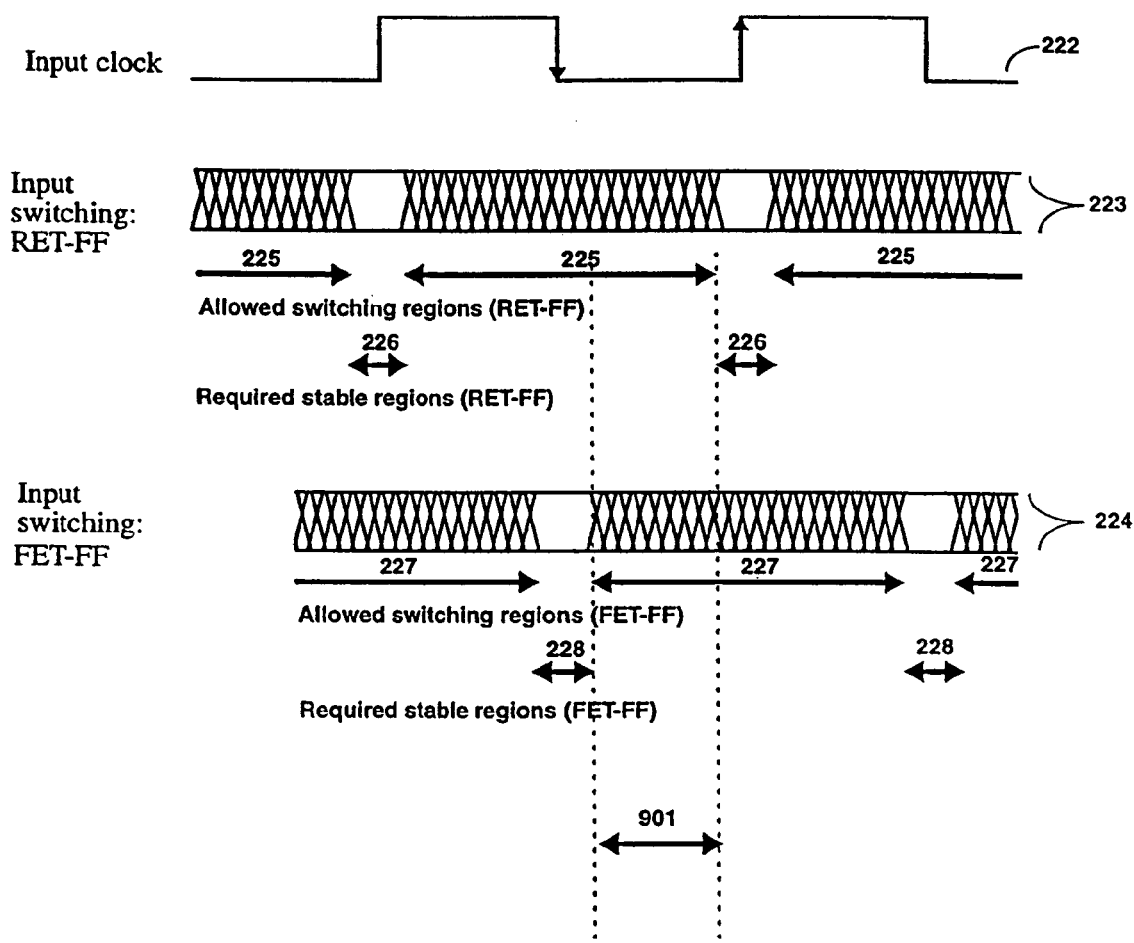

FIG_8
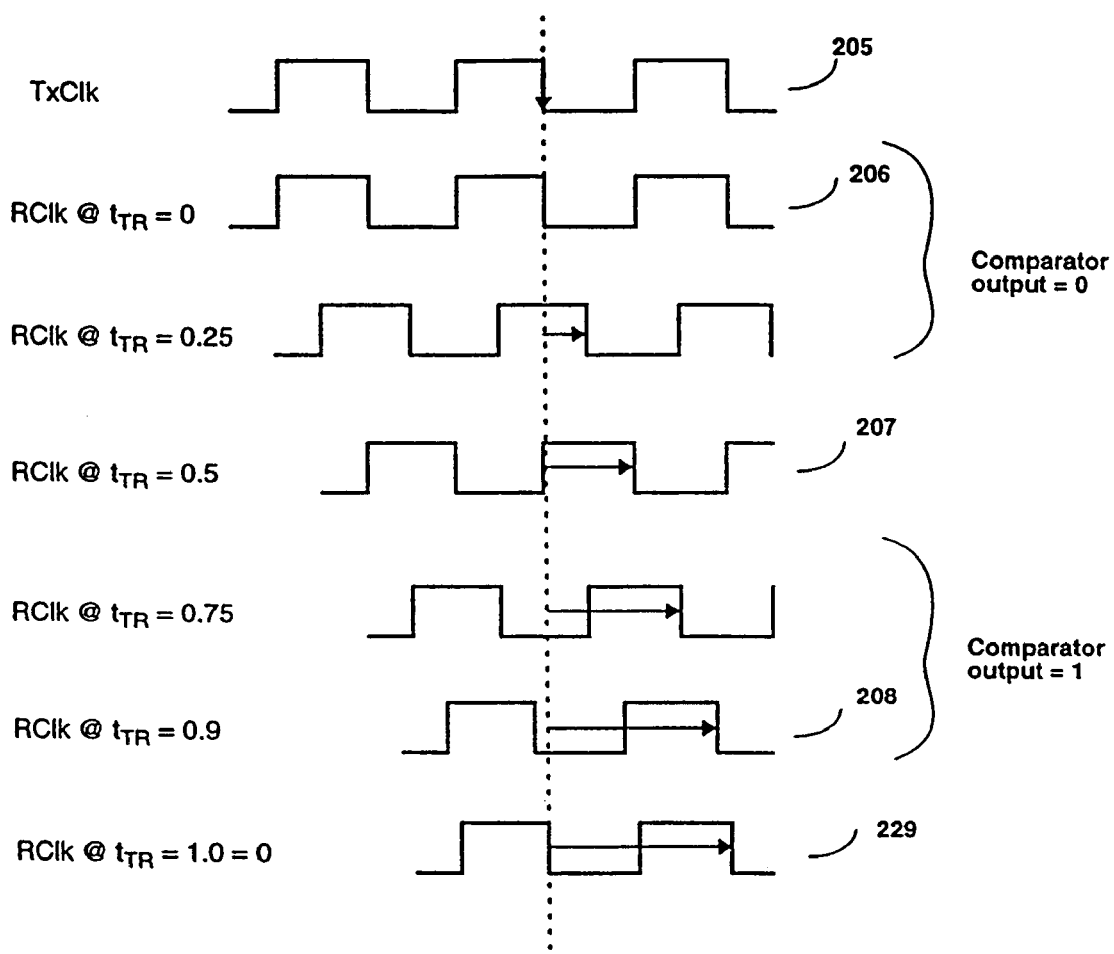

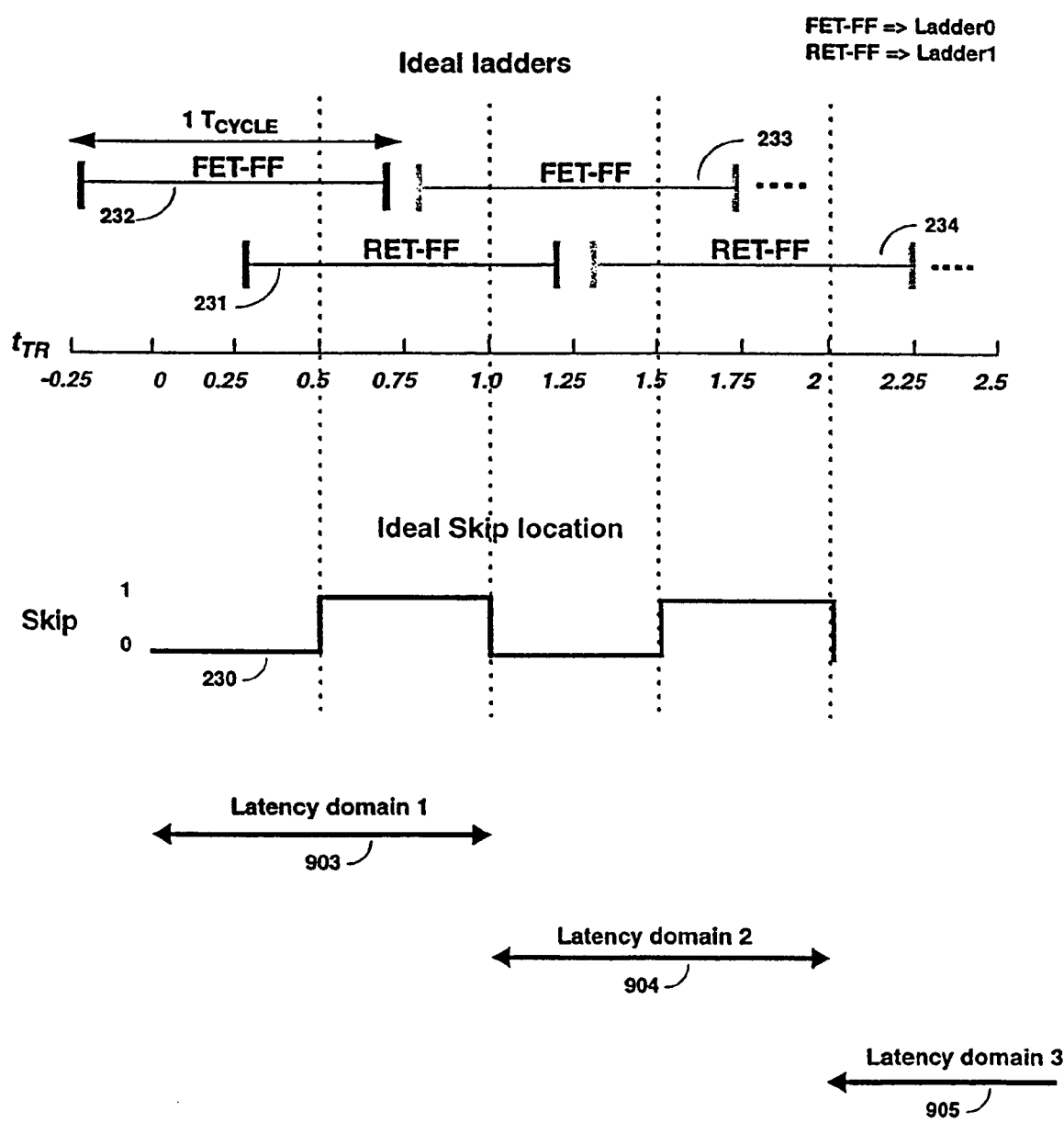
FIG_9

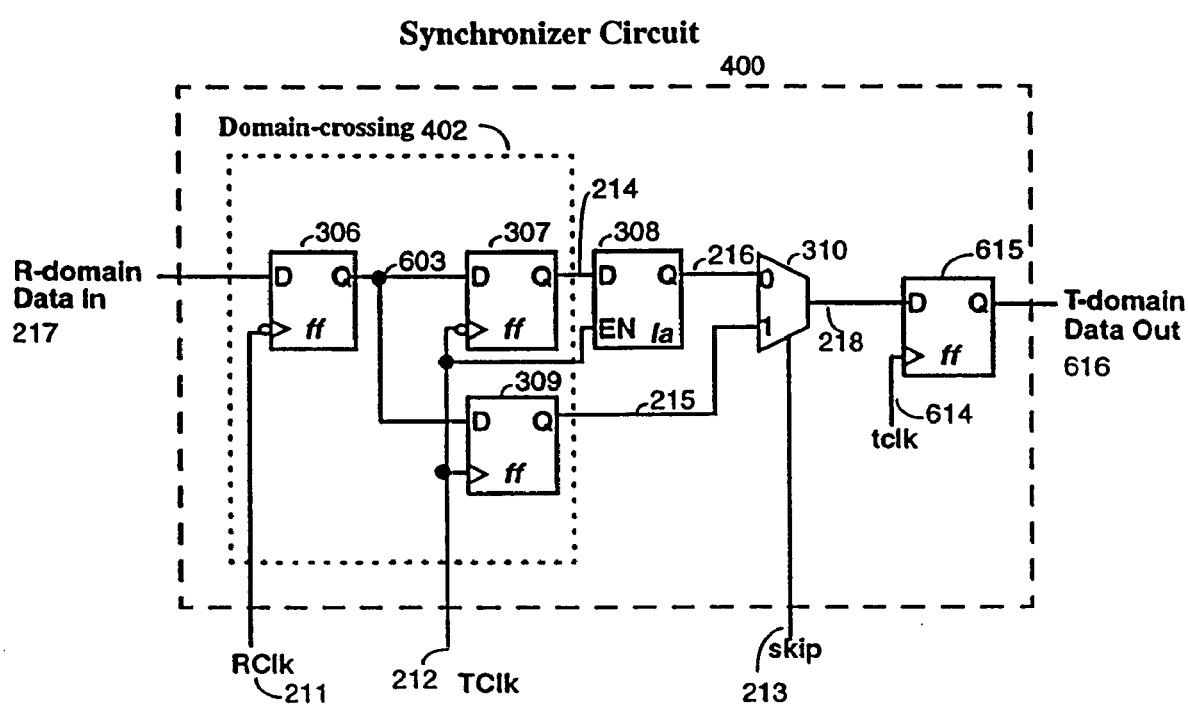
FIG_10

FIG_11
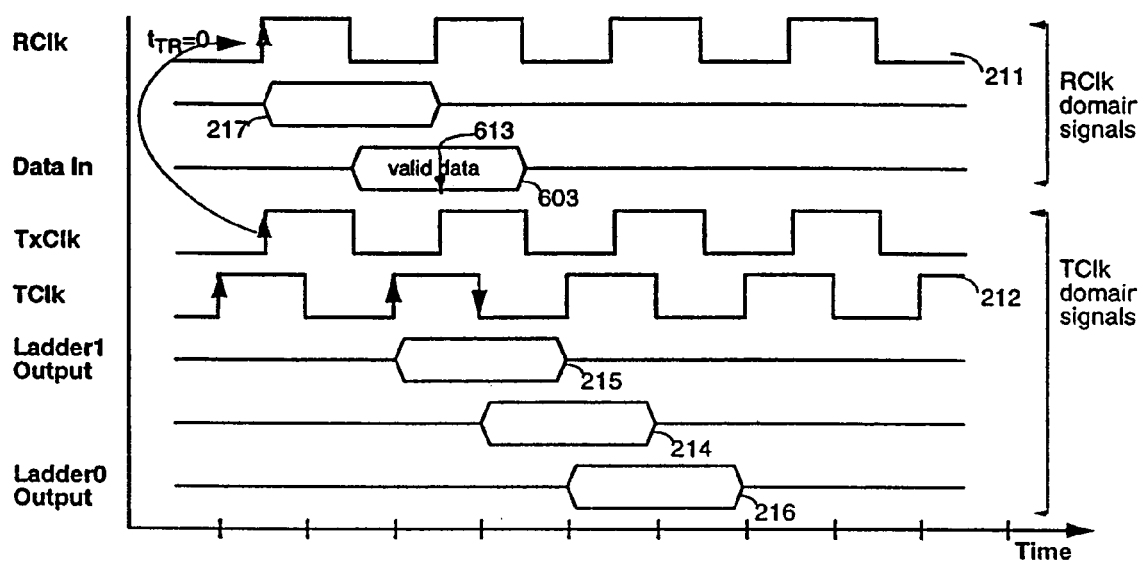

FIG_12
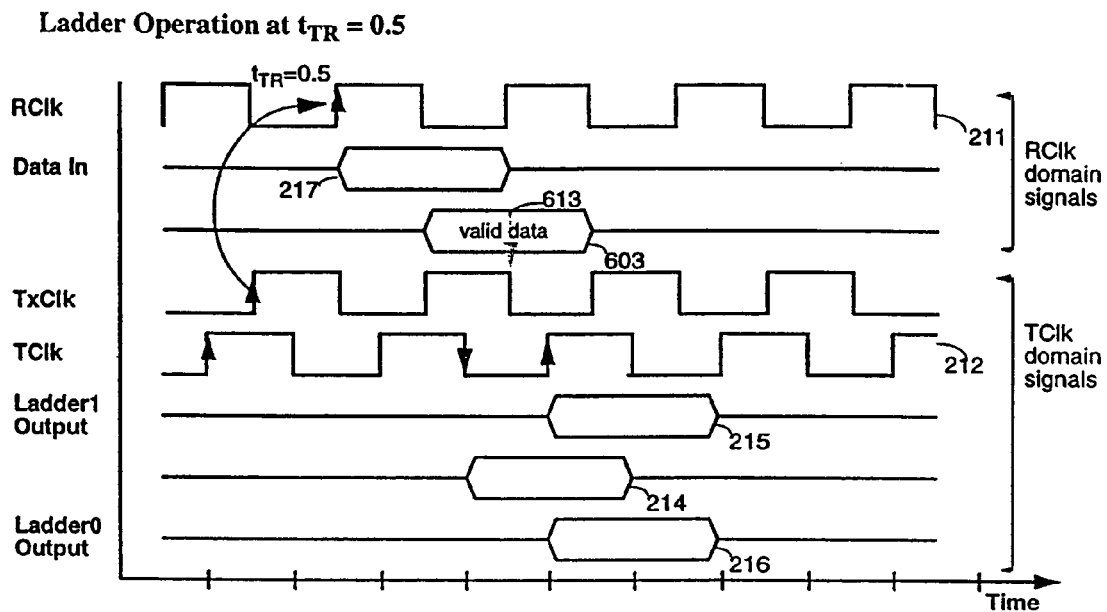
FIG_13
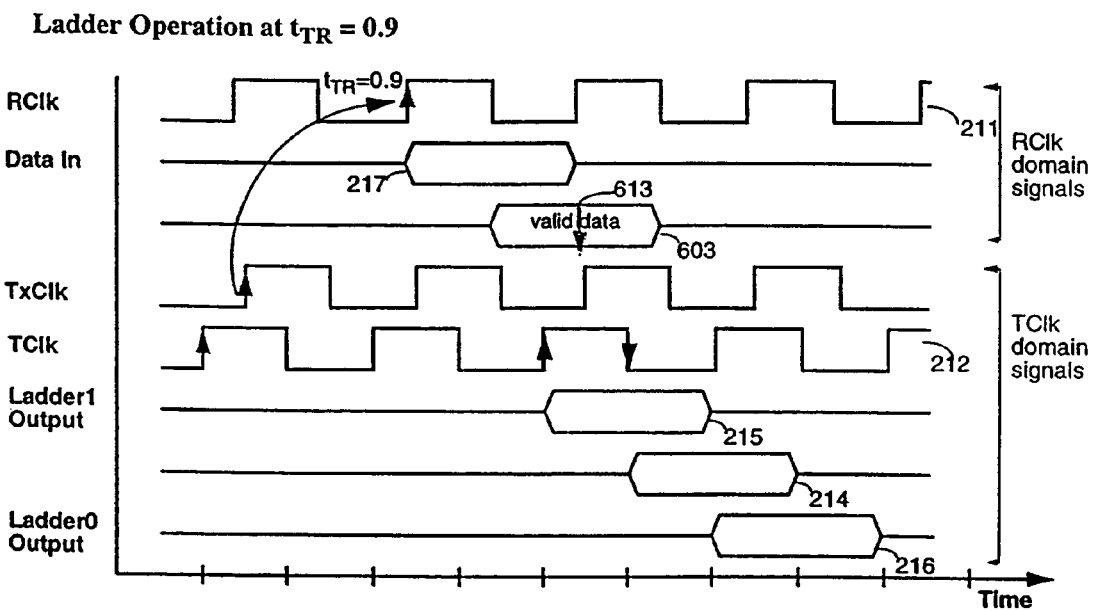

FIG_14
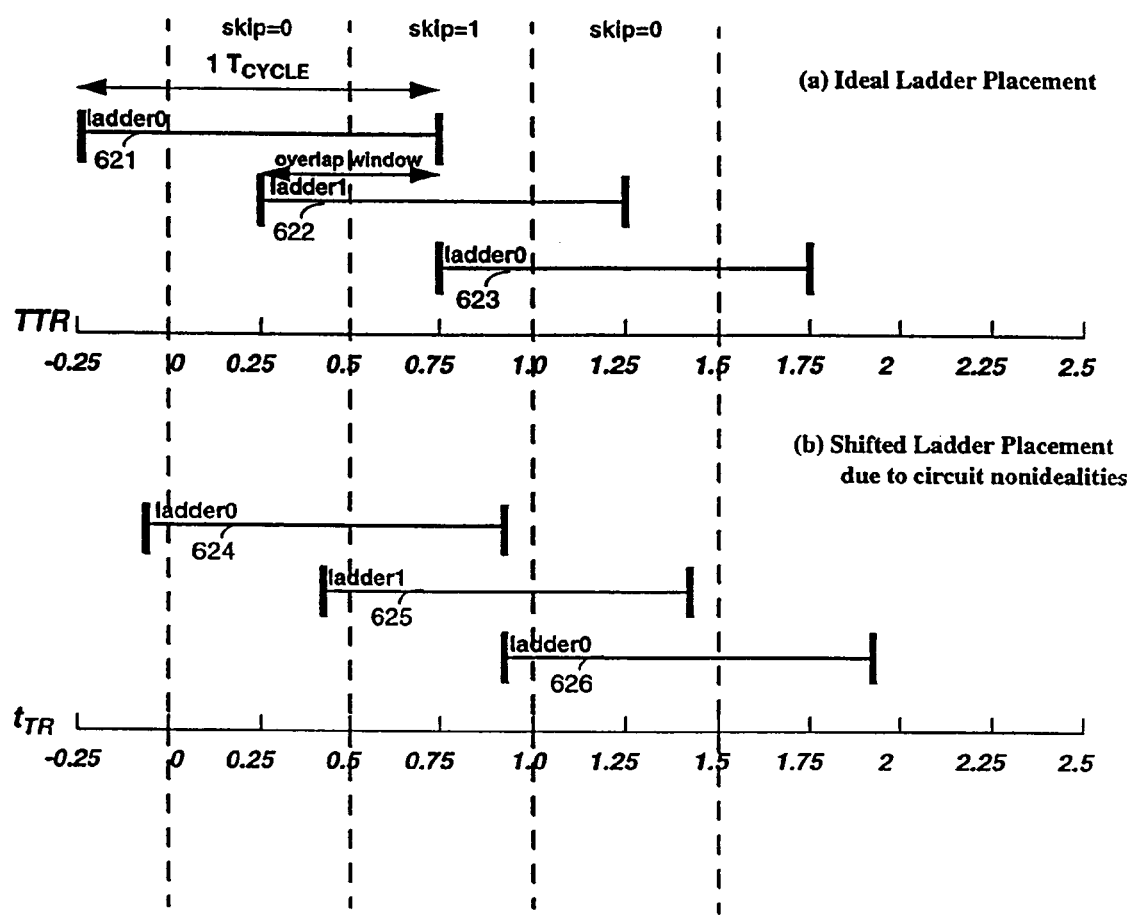

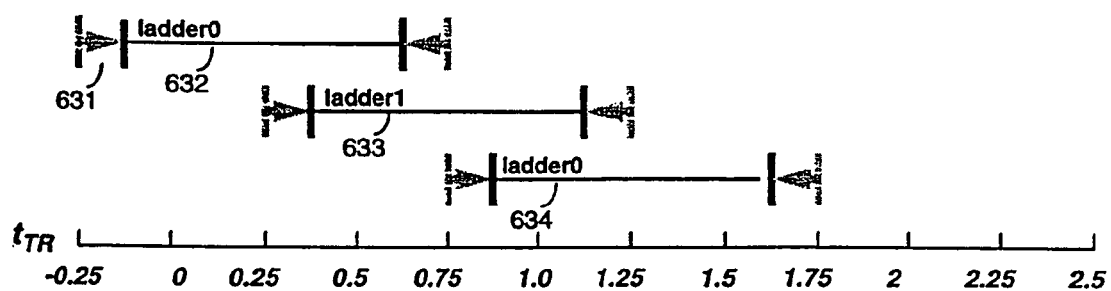
FIG_15

FIG_16
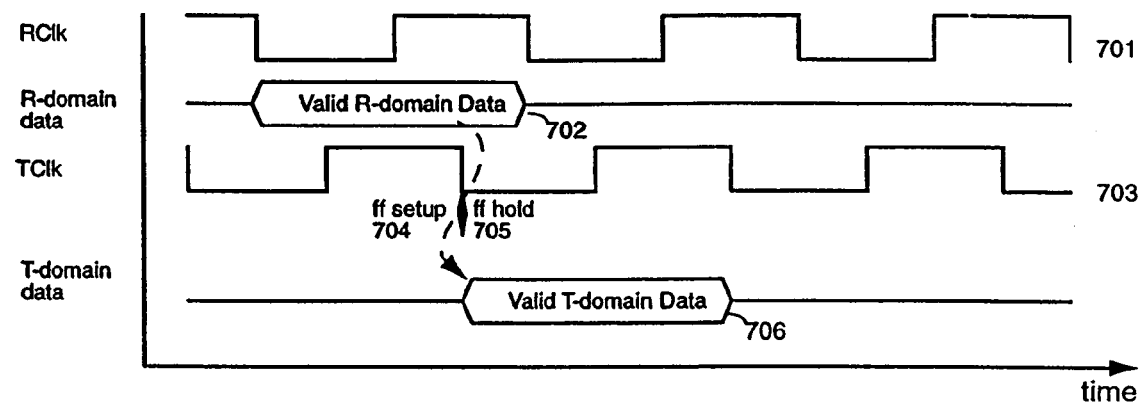

FIG_17
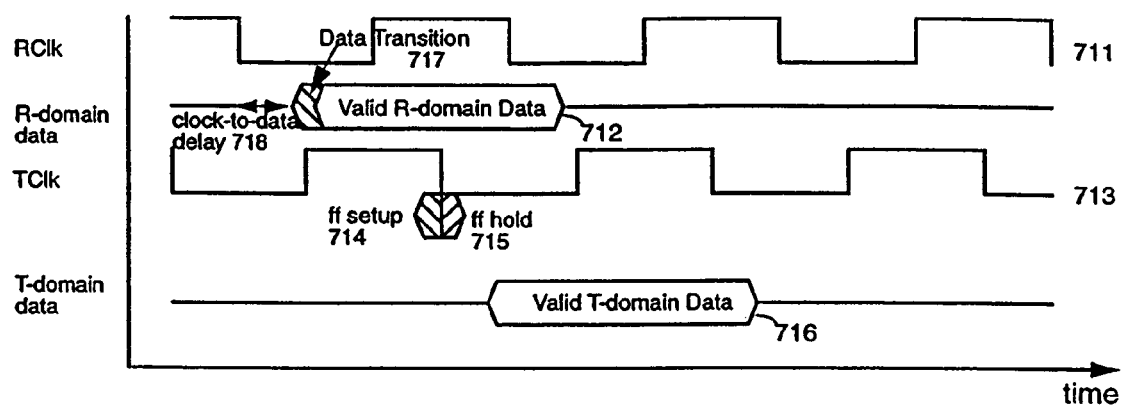

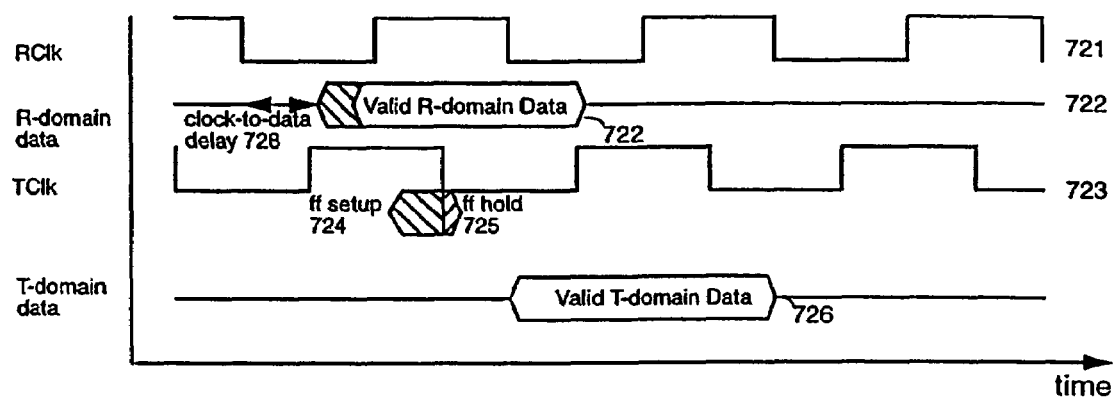
FIG_18

FIG_19
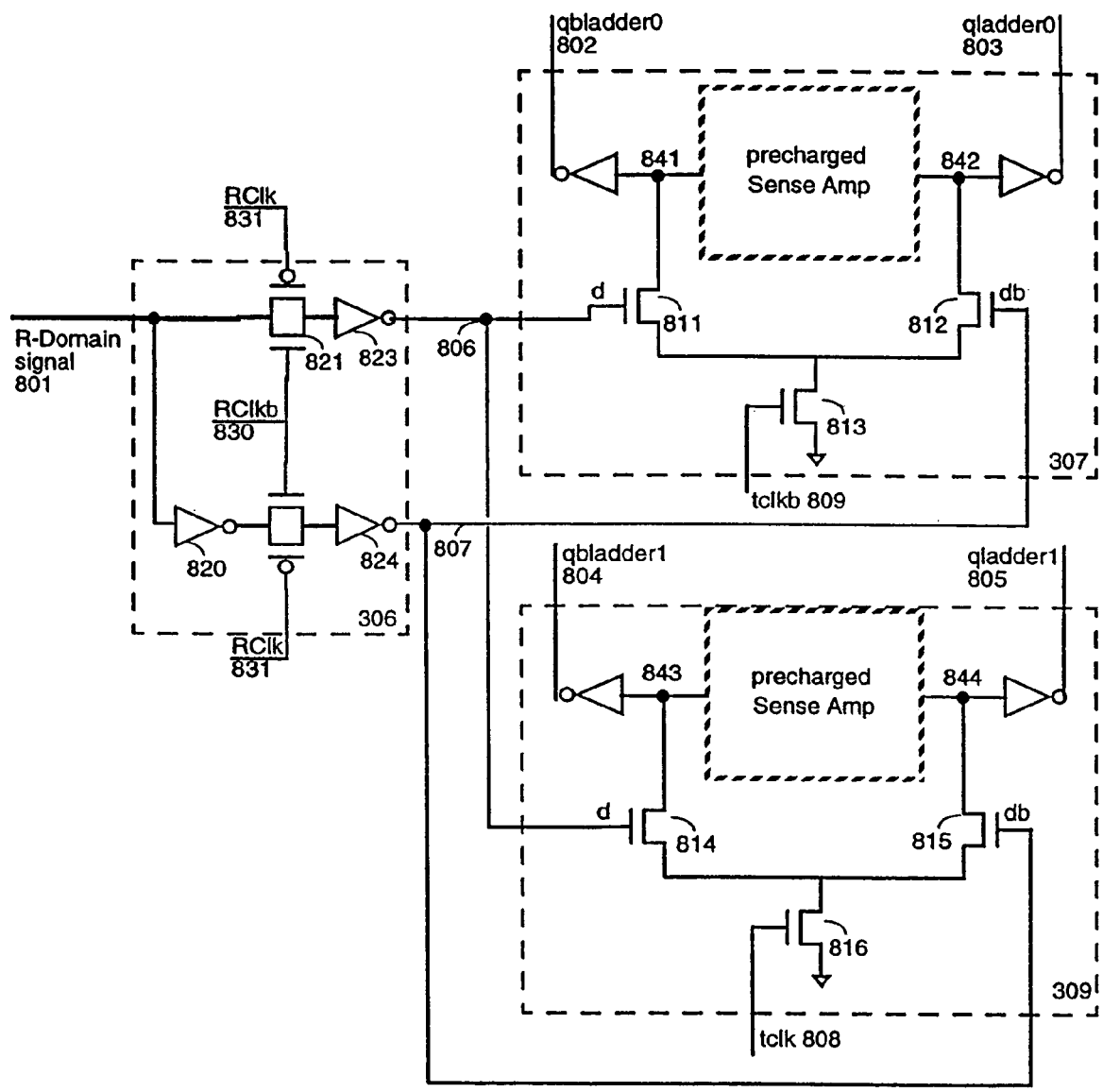

FIG_20
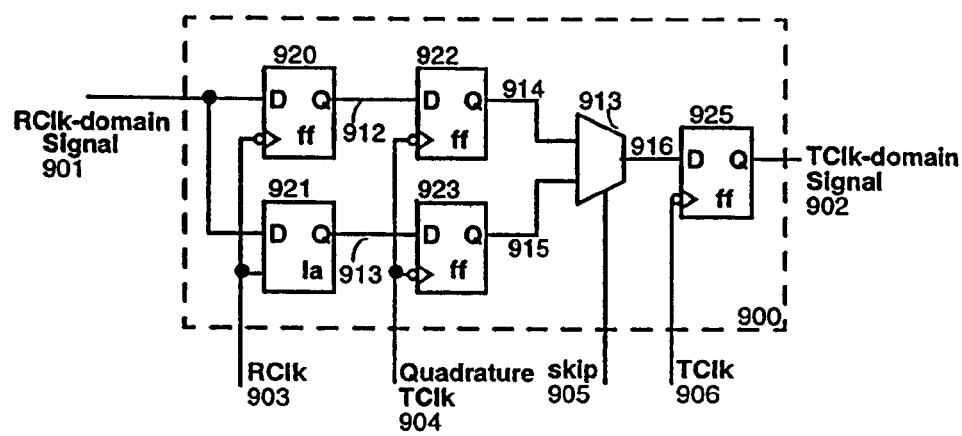
FIG_21
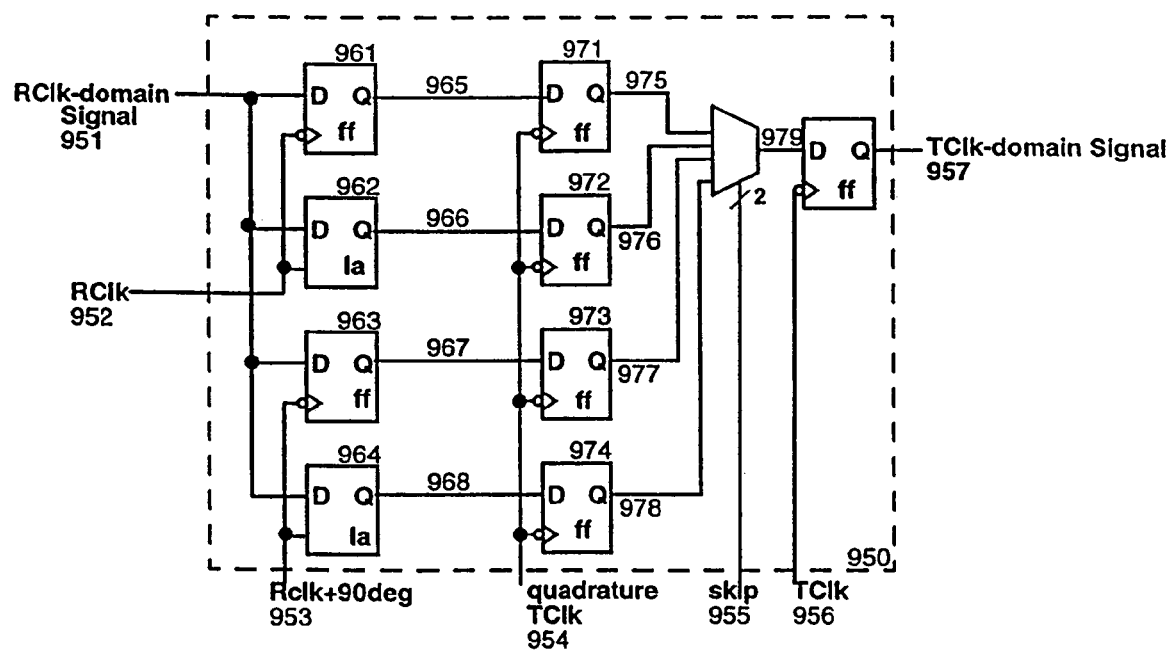

FIG_24
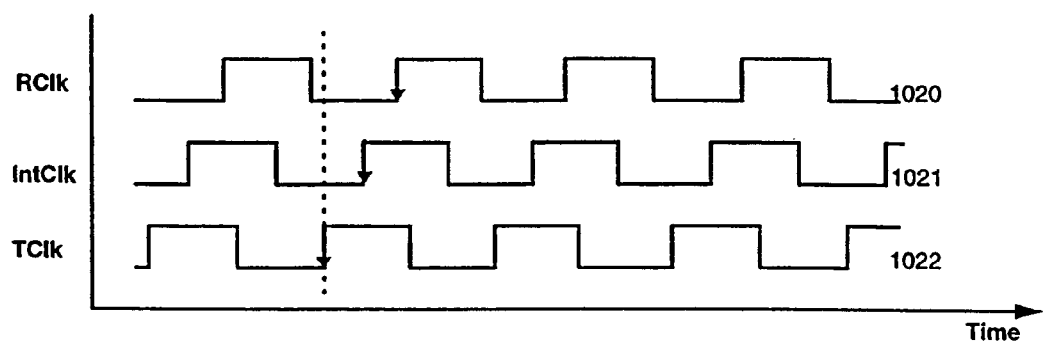
FIG_25
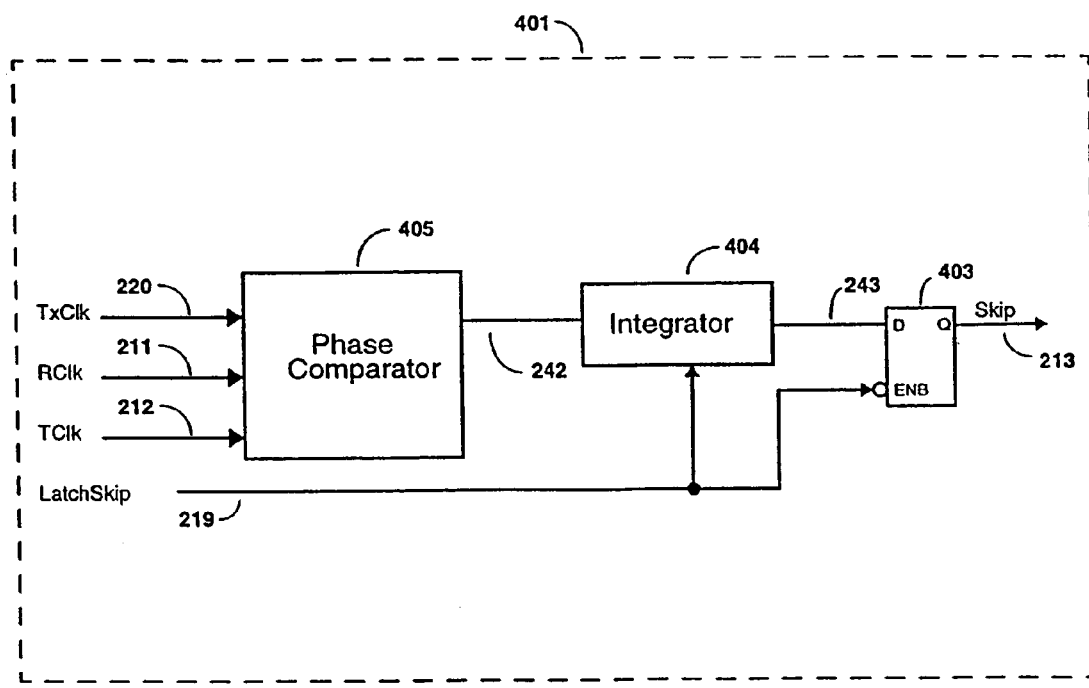

FIG_26
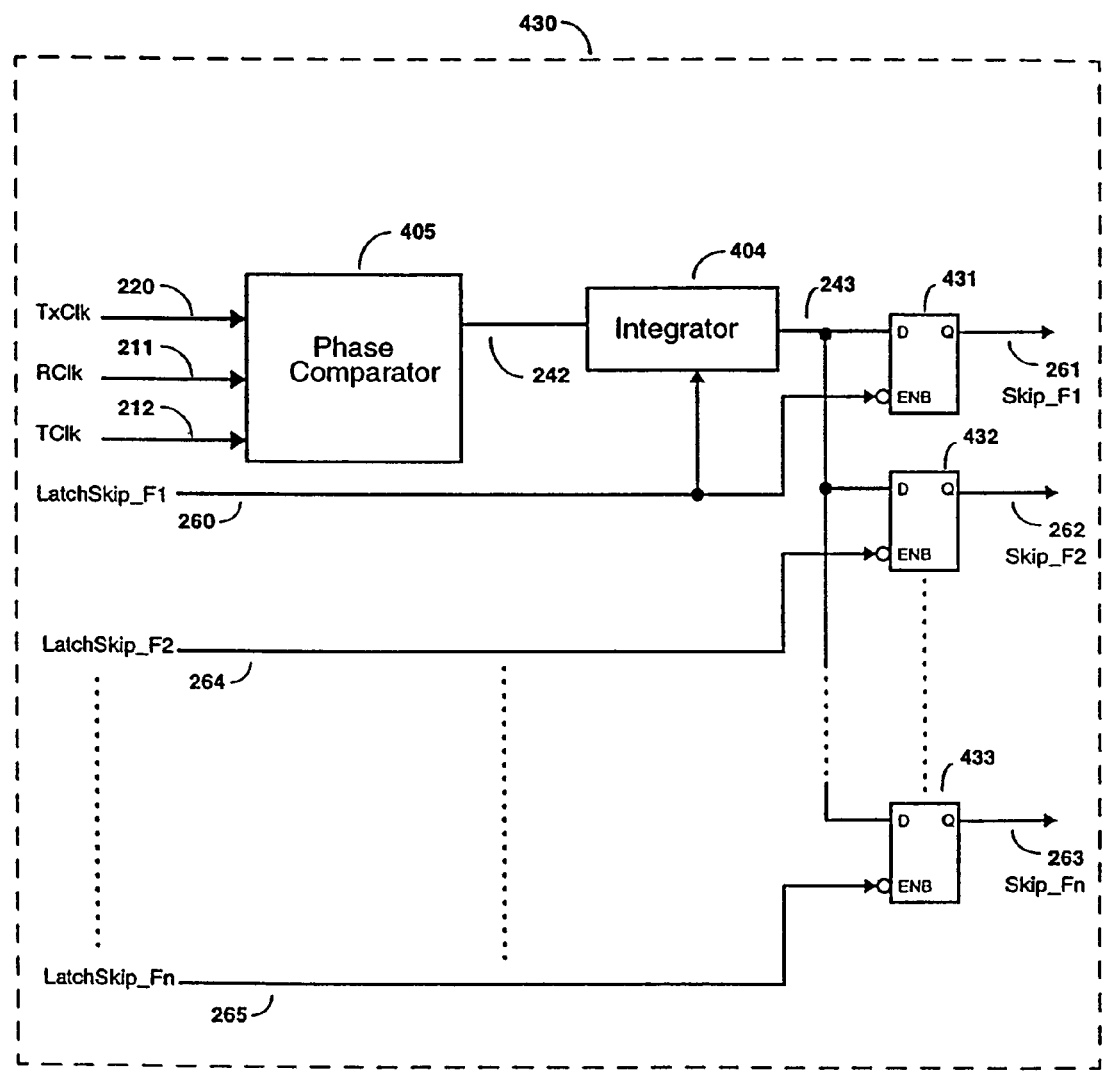

FIG_27
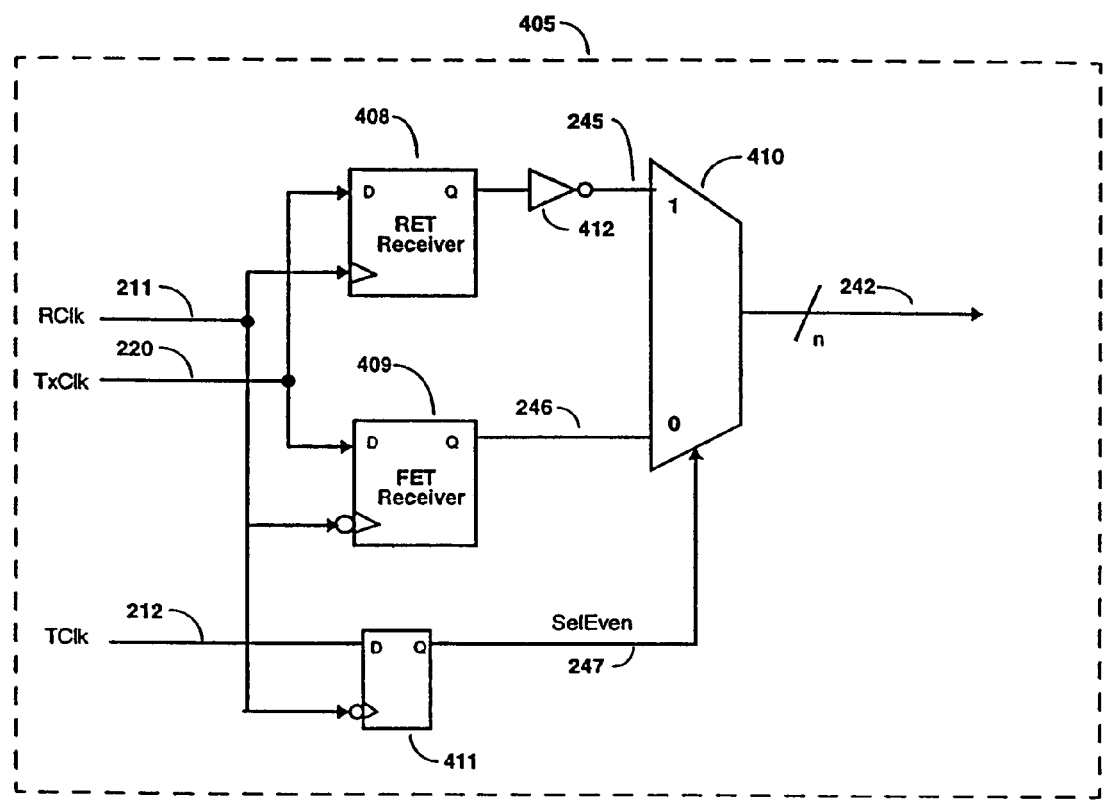

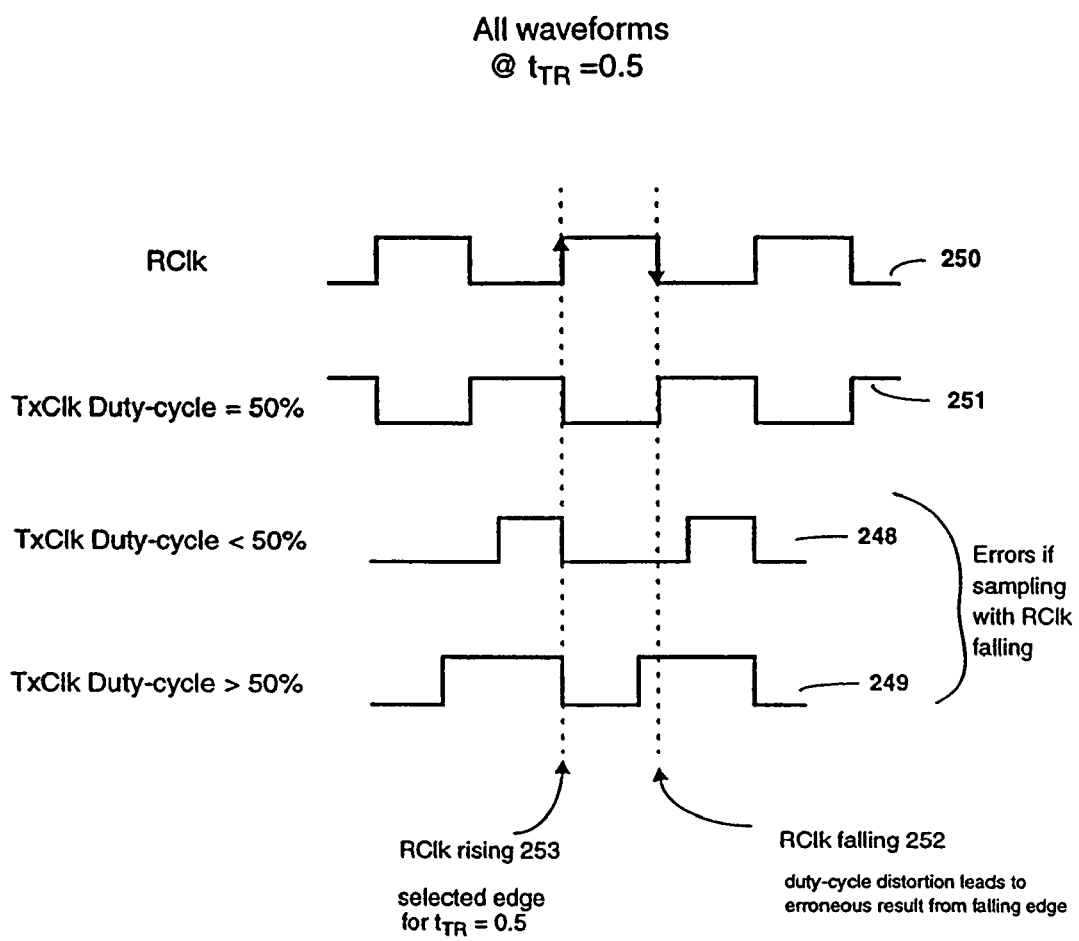
FIG_28

FIG_29
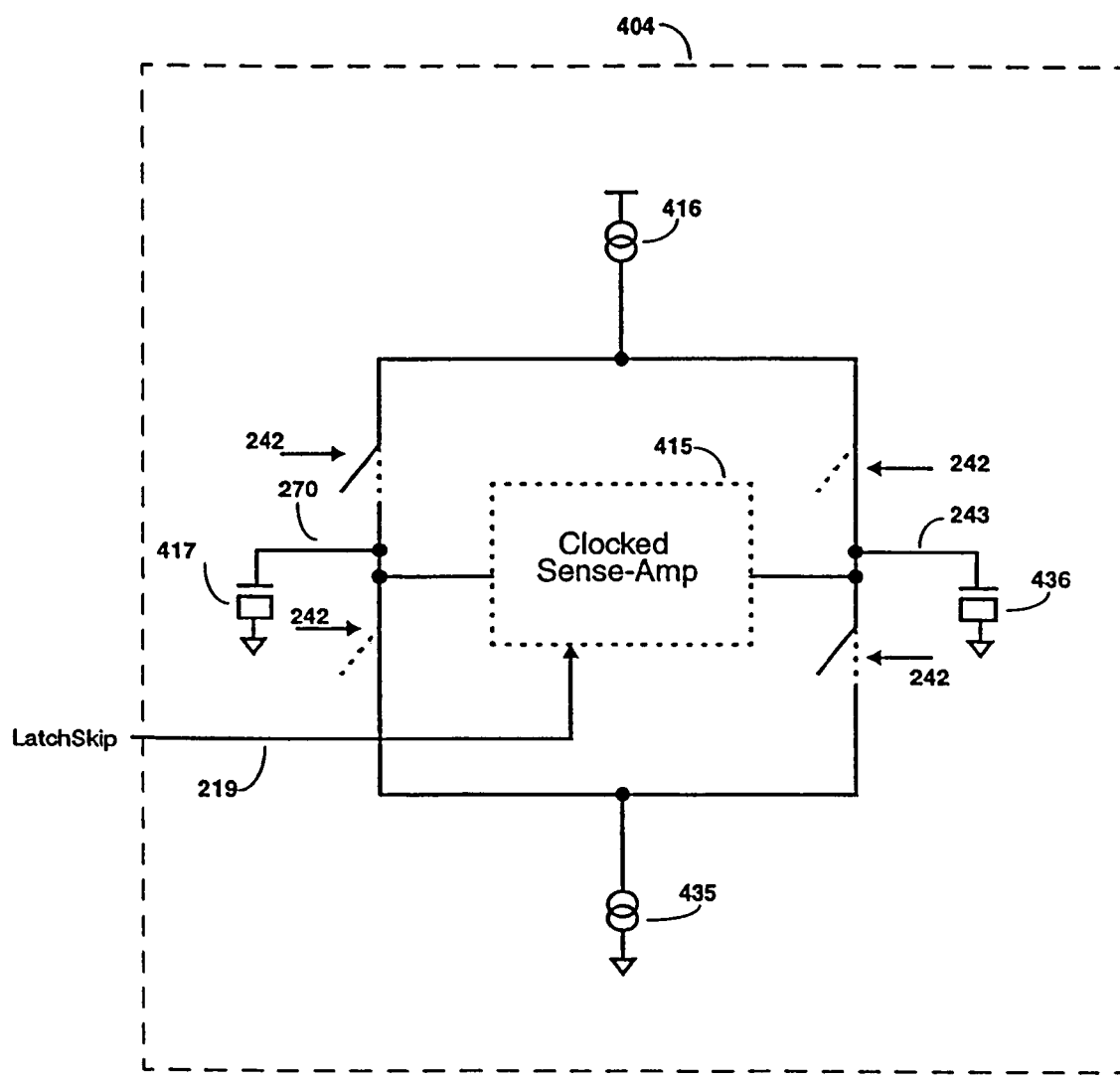

METHOD AND APPARATUS FOR FAIL-SAFE RESYNCHRONIZATION WITH MINIMUM LATENCY

RELATED APPLICATIONS

This application is a continuation of patent application Ser. No. 10/282,531, filed Oct. 28, 2002, now U.S. Pat. No. 6,949,958, which was a continuation of patent application Ser. No. 09/169,372, filed Oct. 9, 1998, now U.S. Pat. No. 6,473,439, which claimed priority to the provisional patent application entitled "Method and Apparatus for Fail-Safe Resynchronization with Minimum Latency", Ser. No. 60/061,505, filed Oct. 10, 1997.

BACKGROUND OF THE INVENTION

The present invention relates to circuits for synchronizing data transfer between clock domains of the same frequency but different phase, in particular for synchronous memory systems.

Mesochronous systems consist of two or more different clocks running at the same frequency with an arbitrary phase relationship. In such systems synchronization failures-can occur when passing data from one clock domain into another. While this problem is similar to that of asynchronous systems, it is easier to solve in that both clocks are running at the same frequency. It is possible to achieve reliable lower latency data transfer than is possible in asynchronous systems because of this constraint.

Computer systems typically use a bus to transmit data between separate components. In order to transmit data at the highest rates with the lowest latency, synchronous transmission is frequently used. In one embodiment (see FIG. 1), a transmit clock is sent along with the data signal down a bus until it reaches the receiving device where it can be used to clock the data. This is done so that the delay the signal sees when traveling down the bus wire is matched by the delay of the clock traveling down a matched bus wire. If the same technique is used to send clock and data in both directions, then the transmit and receive data (and clocks) can have phase relationships that depend on the position of the device along the bus. When crossing from the receive clock domain to the transmit clock domain inside the part, it becomes necessary to re-time the data, or at least to re-time a control pulse to the transmit clock domain. Prior art implementations placed restrictions on the length of such buses. In bussed systems such as FIG. 1, the length of a bus determines the phase relationship between receive and transmit clocks.

It is convenient to view any phase difference between two mesochronous clocks as a fraction of the clock cycle time. With two clocks of cycle-time TCYCLE and with phase relative to the source defined as tTxClk for the transmit clock and tRClk for the receive clock (see FIG. 5) then tTR is the relative phase between the falling edges of the clocks as a fraction of the clock cycle time and can be represented as:

$$t_{TR} = \frac{t_{RClk} - t_{TxClk}}{t_{CYCLE}}$$

With this definition, the phase position of two clocks with exactly the same relationship would be tTR=0, and two clocks who are inverted from each other would be tTR=0.5, etc. U.S. Pat. No. 5,432,823 to Gasbarro uses a fixed latency protocol to provide output data at a consistent latency despite clock skews. Because of limitations in circuit performance, the maximum skew, and thus bus length in one embodiment of Gasbarro (see FIG. 2) has a tTR limit. If a device was placed beyond this limit, its output data latency could be uncertain, as the internal synchronization circuits would be near their failure point. Prior art, using a fixed-latency protocol does not provide control for the transition from one latency to another. To eliminate this occurrence, limitations are sometimes placed on the tTR range of operation, and thus potentially on the maximum bus length and device count.

Another system is described in copending application Ser. No. 08/897,658 of Portmann et. al., filed Jul. 21, 1997, and commonly assigned with this application (see FIG. 3). Portmann describes chains of flip-flops which can gradually be used to re-time data from one domain to another. Such re-timing systems are actually a subset of the arbitrary-phase problem; the skew between clocks in Portmann can be easily recreated by adding a matching delay chain on-chip. Such systems also suffer from large latency from input to output data, as each flip-flop in the chain can add another cycle of output latency. They also suffer from the same uncertainty at the latency domain switching-point as Gasbarro, and so are unsuitable for use in systems with arbitrary phase-relationships between clocks, such as would be encountered in long-buses.

The present invention allows for unlimited tTR. By supporting a mixed-latency protocol it allows for tTR greater than 1.0 without uncertainty concerns by creating firm latency domains. Unlike prior art, it maintains the output latency chosen during initialization despite any Vdd or temperature variations that may later occur. In addition, this invention includes circuits that allow operation at higher frequencies than prior art.

SUMMARY OF THE INVENTION

The present invention provides a synchronization circuit having two latching circuits which latch data from a receive clock domain on both the rising and falling edges of a transmit clock. The selection of which latch data to use is based on a phase measurement of the phase difference between the receive and transmit clocks, which provides a select signal to a multiplexer connected to the two latching circuits. The phase difference is chosen to provide data which is as close as possible to the middle of an overlap region of valid data for the two latches. Once this value has been chosen, it is frozen in a latch after initialization. Since the data could have one, two or more clock cycle latencies from its origin, freezing the clock selection also freezes the latency period for operation of the circuit. Thus, although the synchronization circuit only knows the relative phase difference, not the latency, it can establish a stable operating configuration.

The terms "receive" and "transmit" clock domains refer to reception and transmission by the synchronization circuit, and does not necessarily correspond to received and transmitted data by a device, such as a memory device. The invention is particularly useful in a synchronous memory system in which multiple DRAM are placed along a synchronous bus, at varying latencies from a clock origination point. The re-clocked data at each individual DRAM could be in a first latency period or a second latency period. The overall system may be equalized by adding latency to devices having less of a latency period to thus provide that all the data will be placed on the bus at the same time.

In a preferred embodiment, the receive clock domain data is provided through a flip-flop clocked by a receive clock. The two latching circuits are preferably flip-flops utilizing a precharged sense amp in order to minimize shifting of the clock due to set-up, hold and clock-to-data-out variations.

Preferably, the phase measurement circuit has a phase comparator coupled to receive the receive clock and also a clock which is in quadrature with the transmit clock, rather than the transmit clock itself, in order to place the ultimate skip signal at the point of maximum overlap of valid data. The output of the phase comparator is provided to an integrator in order to remove any jitter and narrow any uncertainty in the decision point. Preferably, an external transmit clock is used, rather than one that has been synchronized using a DLL or PLL, in order to eliminate another possible source of jitter. For a further understanding of the nature and advantages of the invention, reference should be made to the following description taken in conjunction with the accompanying drawings.

BRIEF DESCRIPTION OF THE DRAWINGS

FIG. 4 is a diagram of mixed-latency domains.

FIG. 5 is a diagram of clock relationships.

FIG. 6 is a block diagram of a preferred embodiment of a resynchronization system.

FIG. 7 is a diagram of input windows; RET-FF/FET-FF.

FIG. 8 is a diagram of comparator characteristics.

FIG. 9 is a diagram of ladder ranges.

FIG. 10 is a diagram of synchronizer circuit.

FIG. 11 is a diagram of synchronizer timing at tTR=0.0.

FIG. 12 is a diagram of synchronizer timing at tTR=0.5.

FIG. 13 is a diagram of synchronizer timing at

FIG. 14 is a diagram of shifting ladders due to synchronizer circuit variations.

FIG. 15 is a diagram of the narrowing ladder due to circuit deadband.

FIG. 16 is a diagram of source of ladder shift and shrinkage (ideal elements).

FIG. 17 is a diagram of source of ladder shift and shrinkage (typical elements).

FIG. 18 is a diagram of source of ladder shift and shrinkage (slow elements).

FIG. 19 is a diagram of synchronizer partial embodiment.

FIG. 20 is a diagram of an alternate synchronizer.

FIG. 21 is a diagram of four-phase synchronizer.

FIG. 24 is a diagram of blended ladder synchronizer clock timing.

FIG. 25 is a diagram of skip circuit embodiment.

FIG. 26 is a diagram of skip circuit alternate embodiment.

FIG. 27 is a diagram of a phase comparator embodiment.

FIG. 28 is a diagram of a phase comparator response to TxClk duty cycle error.

FIG. 29 is a diagram of an integrator embodiment.

DESCRIPTION OF THE PREFERRED EMBODIMENTS

Overview of Invention

Figure 1:
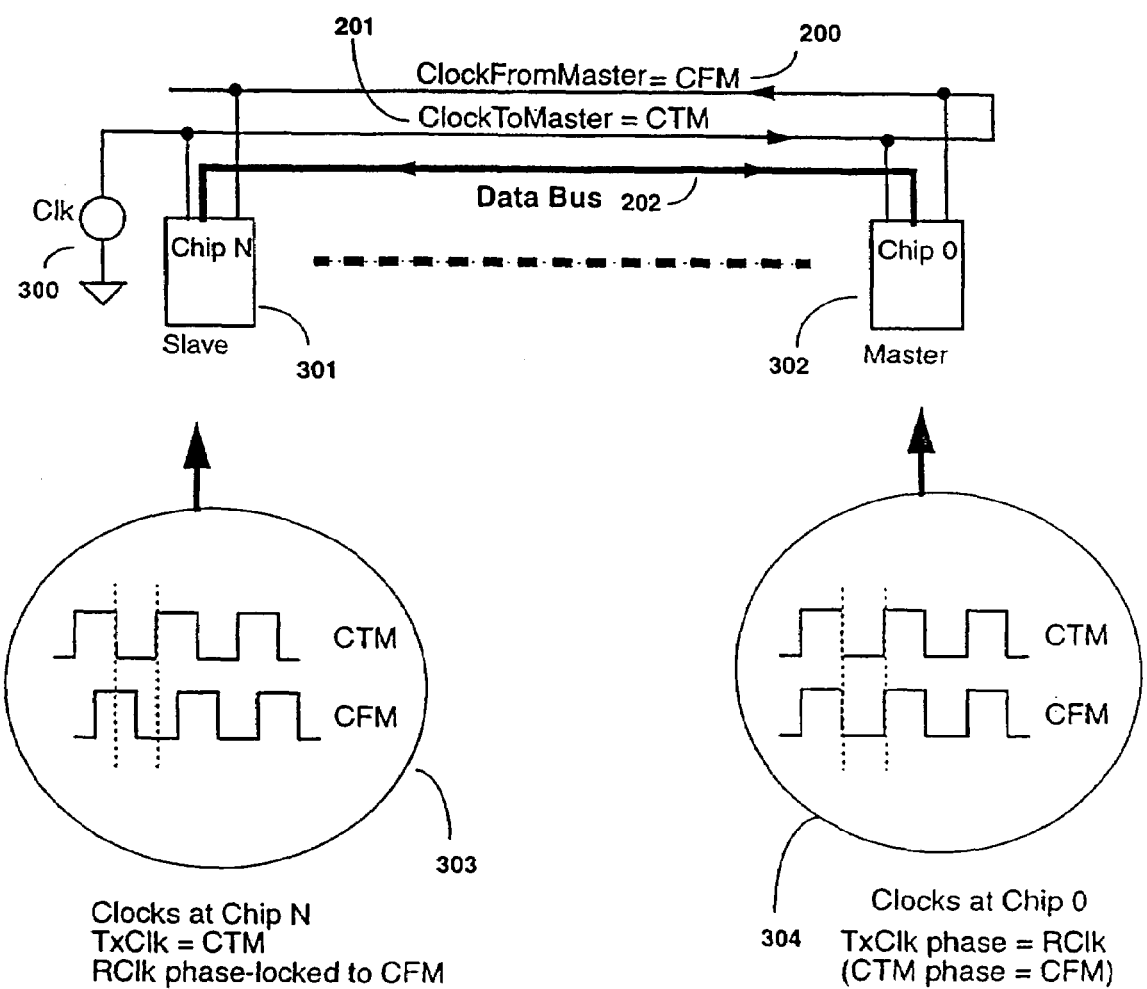
FIG. 1 is a diagram of a system containing clocks sent with data.
Figure 2:
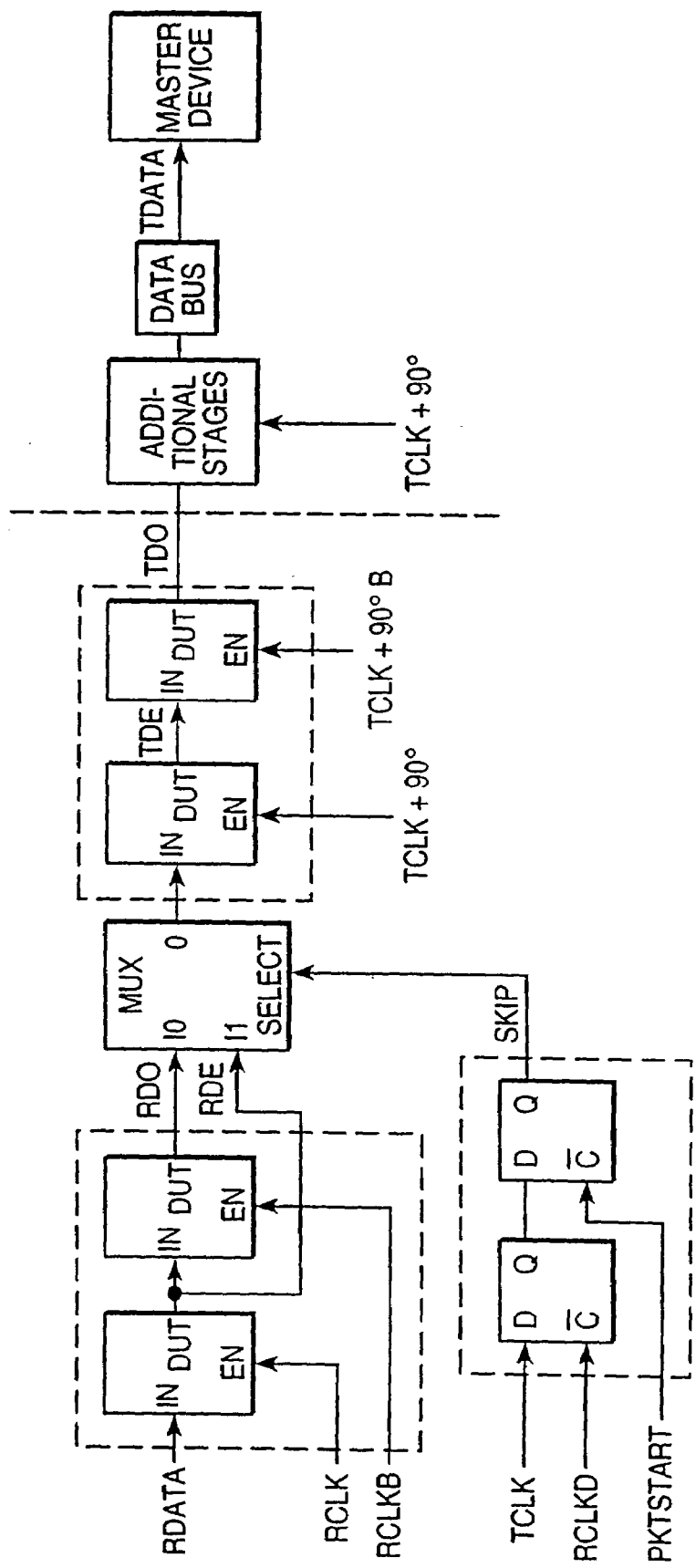
FIG. 2 is a diagram of a synchronization circuit of Gasbarro et. al.
Figure 3:
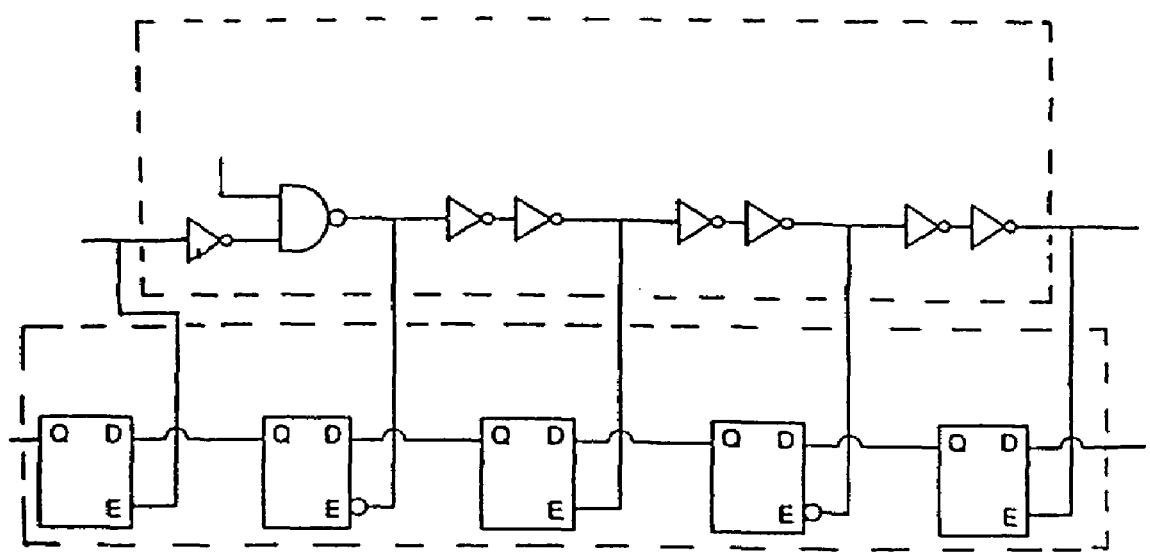
FIG. 3 is a diagram of a synchronization circuit of Portmann et. al.

This invention makes it possible to take input data of arbitrary phase and re-time it into a second mesochronous clock domain with minimal latency. A block diagram of the preferred embodiment is shown in FIG. 6. It achieves this re-timing via the Synchronizer 400 and the Skip Circuit 401. Each of these distinct circuits and their functions will be described separately, with their operation together described last.

Definitions

There are several terms which aid in the following discussion of the invention.

Rclk: Clock phase-locked to Bus-receive clock (204 in FIG. 5). Duty-cycle corrected.

TxClk: Transmit clock as seen on Bus. TxClk lags TClk by 90° (203 in FIG. 5). Not duty-cycle corrected.

Tclk: Clock signal in quadrature with TxClk to facilitate centering of output data around transmit clock. Duty-cycle corrected.

tTR: Time delay from TxClk to RClk divided by the clock cycle-time. This number can also be expressed as a phase value in units of degrees. In systems like FIG. 1, tTR can be directly correlated to the position of a device on the bus.

Skip Circuit: Circuitry which detects the tTR phase value from two clocks, and outputs control signals to a Ladder circuit.

Clock Domain: All circuitry operating from a clock having a particular phase. Circuits whose flip-flops and latches are clocked by clock-X are said to be in the "X-domain".

Ladder: Timing synchronizer which passes data the Received clock domain (A-domain) and the Transmit clock domain (T-domain)

Ladder0: Circuitry which operates on the falling edge of TClk to receive the RClk-domain data Ladder1: Circuitry which operates on the rising edge of TClk to receive the RClk-domain data Skip Value: Output value from Skip Circuit which selects either Ladder0 or Ladder1 of the synchronizer circuit.

RET-FF: Rising-Edge-Triggered Flip-Flop; e.g. a flip-flop which can only change its output on the rising edge of the clock.

FET-FF: Falling-Edge-Triggered Flip-Flop; e.g. a flip-flop which can only change its output on the falling edge of the clock.

Latency domain: A range of tTR values where the output data becomes valid within the same clock cycle.

TCYCLE: The clock cycle time

Overview of Synchronizer 400

The synchronizer 400 of FIG. 10 consists of clock-domain crossing circuitry 402 as well as a re-timing latch 308 and multiplexer 310. The clock-domain crossing circuitry is where the data is adjusted from the RClk domain into the TClk domain. The basic idea behind the clock domain crossing circuitry is straightforward. The input data is guaranteed to be at least one clock-cycle in length. Given input data of this type, if it is fed into both rising and falling-edge triggered flip-flops, at any phase offset one of the flip-flops will be able to correctly sample the input data. This concept is illustrated in FIG. 7. Those skilled in the art will appreciate that edge-triggered flip-flop circuits have required times of input stability called setup & hold times, 226 and 228. In these regions, if the input data to a flip-flop transitions, its output data can be unknown or is an unreliable representation of the input. Conversely, flip-flops have large times when the inputs are allowed to change 225 and 227 and there is no resultant change on the output. By observing the overlap 901 of regions 225 and 227 it can be understood that, given input data with any phase offset, if one RET-FF and one FET-FF are configured as in 402, one of the two flip-flop types (and frequently both of them) will be presented with input data in a valid switching region. Thus, at least one of the two flip-flops will have correctly received the input data, even if the data arrives in the other flip-flop's setup & hold region. The output of FET-FF 307 is then re-timed through latch 308 (see FIG. 10) so that both inputs 216 and 215 to multiplexer 310 have the same timing relationship. In this case the outputs are set to be rising-edge based; in an alternate embodiment, a negative-enable latch could be placed after RET-FF 309 instead and the output from the multiplexer would be falling-edge based. The two data paths that create the inputs to multiplexer 310 are named ladders, as the re-timing function they perform is akin to a "fish-ladder" used to aid fish in swimming-upstream. RET-FF 309 makes up Ladder1 while FET-FF 307 and latch 308 make up Ladder0.

Overview of Skip Circuit 401

The function of the Skip circuit 401 is to generate an output signal which represents the phase skew between two input clocks. It must do this with both precision and accuracy in its determination. A block diagram of the Skip Circuit is shown as FIG. 25. It generates its output via a phase-comparator 405 followed by an integrator 404 and then a latch 403. The phase-comparator compares the input phases by sampling one clock with the other (T×Clk is sampled with RClk in one embodiment). If the clocks skew is 0<tTR<0.5 (see FIG. 8) then the phase-comparator generates an output of 0. If the skew is 0.5<tTR<1.0 then the phase-comparator generates an output of 1. To the phase-comparator there is no difference between tTR of 0 and tTR of 1, or between tTR of 0.25 and 1.25, i.e. its behavior is cyclic with phase offset. The phase-comparator is designed with very high gain so its transitions are as close to tTR=0.5 and tTR=1 as possible. To reduce or eliminate the effects of jitter on either clock, the outputs of the comparator are fed into integrator 404. The integrator can be of any conventional form, but contains an input LatchSkip 219 which shuts off integration and ensures full-rail resolution if the integrated value is analog. The integrator serves two purposes. First, it takes the mean of any Gaussian jitter (noise) distribution on the input clocks. Secondly, it further narrows any uncertainty in the decision at tTR=0.5 and 1. Lastly, upon assertion of LatchSkip, the skip latch 403 is closed. This becomes important in the application of the Skip Circuit to multi-latency operation, and will be discussed next.

Overview of Synchronizer & Skip Circuit Operation Together, Long-Bus Operation The synchronization problem becomes one of proper selection between the Ladder0 and Ladder1 via multiplexer 310. This control of multiplexer 310 is accomplished with the Skip Circuit 401. In order to understand the requirements for the Skip Circuit, it is better to first understand the ladder behavior in more detail when used in an arbitrary phase system. Recall that tTR is the phase relationship between T×Clk and RClk. In bused systems, such as those in FIG. 1, where clocks travel in the same direction as data, it is often required that the clock traveling with the data have its edge located in the center of the valid data window. This can be accomplished through a variety of techniques usually involving a DLL or PLL. This results in the creation of a clock in quadrature (90° out of phase) with T×Clk. We will refer to this clock in quadrature with T×Clk as TClk. This clock is needed in order to clock the final output stages which time the output data, with T×Clk lagging TClk by 90°.

In FIG. 9 the working range of the ladders is represented with tTR as the X-axis. In order to understand this figure, it is critical to realize that the X-axis is NOT time; it is tTR, the normalized delay difference between T×Clk and RClk. With this understanding, it can be seen that the working range 232 of Ladder0 is close to one cycle time, in fact it is equal to TCYCLE−(setup+hold time of the flip-flop 307). It can also be noted that the placement of range 232 begins at (−0.25+hold) and ends at (0.75−setup). The reason that the starting and ending are at −0.25 and 0.75, and not O and 1 is that TClk is used for the ladders. TClk is in quadrature with T×Clk which is used to specify tTR.

By observing the first valid operating range of Ladder0 (232) and of Ladder1 (231) in FIG. 9 it can be seen that they overlap. The center of this overlap occurs at precisely tTR=0.5. This, then, is the ideal position for the skip-circuit to change from selection of Ladder0 to selection of Ladder1. This location will provide maximum margin from either failure point in either ladder. Next, observe what happens to a ladder as it is pushed beyond its valid operating range. By observing Ladder0 ranges 232 and 233 one can see that just before tTR=0.75, Ladder0 stops working due to the input data passing beyond its valid data window, but it begins functioning again shortly beyond tTR=0.75. In operating range 233 Ladder0's output has moved an entire cycle. That is, output from Ladder0 in range 233 will have one additional cycle of latency relative to its operation in range 232, and is said to be in latency domain 2 (see also FIG. 4). Both ladders, and indeed any synchronization circuitry will exhibit this behavior if the clock skews are pushed beyond their limit. The control of these different latency domains is a key innovation in this invention.

While Ladder0 operates with latency of 1 and 2 in ranges 232 and 233, so does Ladder1 within ranges 231 and 234. Recall that skip 230 is used to seamlessly choose between Ladder0 and Ladder1 at tTR of 0.5. Skip is also used to transition from Ladder1 back to Ladder0 at tTR of 1.0. While the Skip transition at tTR of 0.5 was in no way visible at the output (i.e., the signals 236, 237, and 238 of FIG. 4 are identical), the outputs 236-238 are quite different from output 239. Although 238 and 239 are shown at the same tTR of 1.0, output 238 has skip=1 and when output 239 has skip set back to 0, an additional cycle of latency is added to the output data.

Since the resynchronization circuitry may be used in a system consisting of bused devices as in FIG. 1, it is critical that the devices not change the latency of their output data if they happen to be placed at exactly a latency boundary. The skip latch 403 (FIG. 25) is used to ensure that after a period of initialization, the value of skip is latched and can no longer change. This guarantees that the output latency will not change unless the circuit is reset by re-assertion of LatchSkip 219. After de-assertion of LatchSkip the output data latency can be guaranteed to not change. Fail-safe operation requires no synchronization failure in the synchronizer 400 as well as stable output latency.

This requires, however, that the skip circuit transitions be placed with accuracy and precision, and that the synchronization circuitry have ladders with accurate placement, little deadband and with minimal movement across any voltage and temperature shifts. Any inaccuracy in the skip position or limits of valid ladder operation will limit the potential operating frequency, operating temperature range, or operating voltage if the Skip Circuit chooses a ladder which is pushed beyond its valid operating range. This invention achieves those requirements to provide synchronization at highest operating frequency, over temperature and voltage variations, with the minimum latency possible for fail-safe operation.

Overview of Generation of LatchSkip

The use of the synchronizer and skip circuit in a system requires a control signal to freeze the output of the Skip Circuit 401, called LatchSkip 219 (see FIG. 25). The assertion of this signal causes the skip value to be sampled and held inside latch 403 of the Skip Circuit 401. If the synchronizer is to be used in systems which span more than one clock cycle this function is normally accomplished during initialization, before the output of the synchronization circuit can be used. This avoids the possibility of outputs with different latencies.

There are multiple possible ways of generating LatchSkip 219 to achieve this function. It can simply be asserted through a device reset. In this way when reset is de-asserted the skip output will be latched and the output latency will be fixed unless the device is reset. There are several other ways LatchSkip 219 can be generated. There are frequently initialization packets that are required to setup a device before use. In this case LatchSkip can be generated by a strobe used to receive one of these setup packets. By ensuring that a setup packet asserts LatchSkip 219, the skip output can be guaranteed to be stable before the synchronization circuit is actually used to re-time output data. Alternately, register or mode bits inside a device can also control the strobing of LatchSkip 219. Combining register control with other techniques allows for the flexibility of later skip evaluation and latching without requiring a device reset.

Overview of Multiple Operating Frequencies

In some applications it may be desirable for the system to be able to run at multiple different operating frequencies. This might be done in order to accommodate different power modes, where lower power can be obtained at lower frequencies by disabling some high-power circuitry. In such an application, it may be desirable to maintain multiple values of Skip, one for each operating frequency. In this case multiple skip latches and multiple LatchSkip signals can be used as shown in FIG. 26. In this system initialization would include the evaluation of the phase comparator and integrator at each operating frequency followed by latching into separate skip latches. The appropriate value of skip for the current operating frequency can then be selected by simply using the corresponding latch output.

Detail of Synchronization Circuit 400

The Timing Synchronizer passes data between sequential circuits of two arbitrary-phased mesochronous clock domains. The synchronizer ensures signals are re-timed fail-safe or without metastability and timing glitches, and with minimum latency from circuits of one clock domain to circuits of another clock domain. In addition, when used to time output data transmission on a bus system such as one shown in FIG. 1, the synchronizer times the output data so it arrives within a particular cycle at the destination.

A preferred embodiment of the timing synchronizer is shown in FIG. 10. This circuit consists of Rclk flip-flop 306, Tclk flip-flops 307, 309, Tclk latch 308, and Multiplexer 310. The synchronizer may be partitioned into two signal paths or ladders (Ladder0, Ladder1), each with its own latency characteristics. Data propagates through Ladder0 via nodes 217, 603, 214, 216; Data propagates through Ladder1 via nodes 217, 603, 215. FIG. 11 shows typical outputs at nodes 215 and 216 for tTR=0.0. (Note that T×Clk lags TClk by 90° in phase.) At this tTR, the output of Ladder0 is 1 clock cycle later than Ladder1. This result is typical of tTR=−0.25 to 0.25. For the tTR=0.25 to 0.75, the outputs of Ladder0 and Ladder1 are identical and indicate the overlap region of the synchronizer, as shown in FIG. 12. Between tTR=0.75 and 1.25 the synchronizer output (see FIG. 13) has moved to the next cycle akin to the relative ladder output positions in FIG. 11. The behavior is thus cyclic with TCYCLE.

In synchronizer 400 circuit operation, flip-flop 306 samples input Data In 217 every RClk cycle, and holds output 603 valid for one clock cycle (see FIG. 11). At the beginning of each clock cycle, the value at node 603 may transition depending on DataIn 217. During this transition period, data cannot be reliably sampled by edge triggered flip-flops. Because TClk flip-flop 307 and 309 sample data on the falling and rising edges of TClk respectively, at least one of these two flip-flops is guaranteed to sample data from node 603 when it is not changing. This is required for fail-safe data resynchronization. For most ranges of tTR neither of the Tclk sampling edges are near node 603's data transition, and both Ladders will capture the correct value. However, over varying values of tTR, output from Ladder0 at node 216 may be zero or one cycle later than the output from Ladder1 at node 215.

Each ladder operates over a particular tTR range of operation without encountering problems with metastability. The range of valid tTR with which each ladder operates is determined by the range where a particular TClk sampling edge 212 falls within Valid Data window 603. For example, if the tTR value is 0.25 (in reference to FIG. 12, RClk 211, DataIn 217, and Valid Data 603 should be shifted earlier by 90°), the sampling rising edge of TClk aligns with the tail portion of valid data 603. For cases where tTR is greater than 0.25, RClk 211, DataIn 217, and Valid Data 603 shifts later in time, until the sampling rising edge of TClk aligns with the beginning portion of valid data 603 at tTR=1.25. The center of each ladder's operating range occurs when the center 613 of the Valid Data window 603 aligns with the ladder's sampling TClk edge. The center of the overlap between the two ladders occurs when Valid Data Center 613 is equidistant from the two sampling TClk edges as in FIG. 12.

Region (a) of FIG. 14 shows the operating ranges of the two ladders in the Synchronizer circuits versus tTR phase values. (In the context of a device on a bus/channel such as that shown in FIG. 1, a particular tTR value may be interpreted as an indicator of the position on the bus.) As discussed in the previous paragraph, Ladder0 ideally operates for tTR range of −0.25 to 0.75 (see FIG. 14(a)/622). Similarly, Ladder1 ideally operates for tTR range of 0.25 to 1.25 (see FIG. 14(a)/622). The overlap window between ladders 621 and 622 in indicates the region where both Ladder1 and Ladder0 outputs are the same. Ladder0 623 is similar to Ladder0 621. However, its output is shifted 1 Cycle later in time. The ends of each ladder shown in region (a) of FIG. 14 indicate tTR operation ranges beyond which the particular ladder is unreliable.

Proper operation should avoid the ends of the ladders. Therefore, even with ideal components, Ladder0 621 may be used for the entire range except at tTR=−0.25, and tTR=0.75; Ladder1 622 may be used for the entire range except at tTR=0.25, and tTR=1.25. In the overlap region, either Ladder0 or Ladder1 may be used. For optimum fail-safe operation, the multiplexer 310 (FIG. 10) should select another ladder before the end of the current ladder is reached. Therefore, the optimal multiplexer select 0 to 1 transition should be at tTR=0.5, and the optimal multiplexer select 1 to 0 transition should be at tTR=1.0. This placement of multiplexer select values over tTR leaves equal amounts of margin for timing errors of non-ideal ladders. These errors will be discussed in the next section. An important point to note is that the input clocks to the synchronizer are periodic, and thus synchronizer characteristics repeat in tTR space.

Practical implementation of the synchronizer yields ladder circuits which do not fully correspond to region (a) of FIG. 14. Each ladder in region (a) of FIG. 14 spans the theoretical full clock cycle of tTR range, resulting in a half cycle of ladder overlap. However, in practice, the synchronizer has less overlap margin due to circuit imperfections. These imperfections take the form of shifting ladder alignment as shown in region (b) of FIG. 14, and narrowing the ladders as shown in FIG. 15. Thus, the ladders each span less than 1 clock cycle, the overlap region spans less than half a clock cycle, and the ladder positions may be shifted from the ideal case.

Analysis of the clock domain crossing indicates the sources of these errors. An examination of the signal flow between flip-flops 306 and 307 in FIG. 10 best illustrates some of the timing errors. In the ideal case, all flip-flops have zero setup-or-hold requirements, and no clock-to-data-out delay. In our example, RClk flip-flop 306 will have no clk-to-data-out delay as shown by waveform 702 (see FIG. 16). Waveform 704, 705 shows zero setup and hold for TClk flip-flop 307. The ideal circuit elements in FIG. 16 will result in a one clock cycle long ladder span with symmetric overlap region between Ladder0 and Ladder1 at both ends of the span.

Actual flip-flops do not perform as well. FIG. 17 and FIG. 18 show the waveforms of flip-flops 306 and 307 (shown in FIG. 10) for a typical and slow performance conditions respectively. The varying circuit performance is due to varying integrated circuit transistor processes, power supply voltage and operating temperature of practical systems. Ladder position shifts are caused by clock-to-data-out delay variation of flip-flop 306 and setup/hold variations of flip-flop 307. These variations are equivalent to shifting Rclk and Tclk (thus effective tTR) in the ideal case shown in FIG. 16. Any mismatched clock buffering of Tclk and Rclk within the integrated circuit contributes additional ladder shifts.

Besides ladder shifts, another source of error is narrowing of the ladder's valid operating region. This narrowing is caused by the data transition time 717 of circuit 306, and setup 714/724 and hold 715/725 of flip-flop 307. Within this period, capture of signal 603 is unreliable and may lead to wrong data. Clock jitter also adds to ladder narrowing by injecting phase shifts to the clocks. Clock jitter adds to the uncertainty region caused by set-up, hold and clock-to-data-out 718/728 variations. Similar analysis applies to the clock domain boundary between flip-flops 306 and 309.

The circuit implementation of the synchronizer addresses the aforementioned Ladder shifts and shrinkage for maximum timing margin over varying process, voltage, and temperature conditions. A partial circuit schematic of one implementation is shown in FIG. 19. This circuit addresses the sources of Ladder shifts and shrinkage with delay compensation and faster circuit performance. To minimize ladder shifting, a precharged sense amp is used for the second stage flip-flops. The clocked sense-amp latching delay varies approximately with the clock-to-data-out delay of the previous stage latch. So in slower transistor performance conditions, the clocked sense-amp will delay its sampling point to compensate for the added clock-to-data-out delay at nodes 806 and Ladder17. The use of differential signals 806, 807 instead of single-ended signal 603 increases the sense-amp gain, and lowers the setup and hold of flip-flops 307, 309.

The Synchronizer circuit shown in FIG. 10 uses the falling edge of RClk 831/830 and the rising and falling edges of TClk 808/809 to generate overlapping Ladder0 and Ladder1. This configuration generates rising-edge triggered outputs. In an alternate embodiment for a falling-edge driven sequential logic system, we could reverse the polarity of the sampling edge of all sequential elements, and achieve proper operation. Alternatively, the synchronizer can use the rising and falling edges of RClk with one sampling edge of Tclk, an embodiment of which is shown in FIG. 20. The basic premise used to achieve clock domain crossing is to use circuits clocked with different phases of one clock domain to pass data into another domain. The end results are overlapping ladders similar to those shown in FIG. 14.

Figure 22:
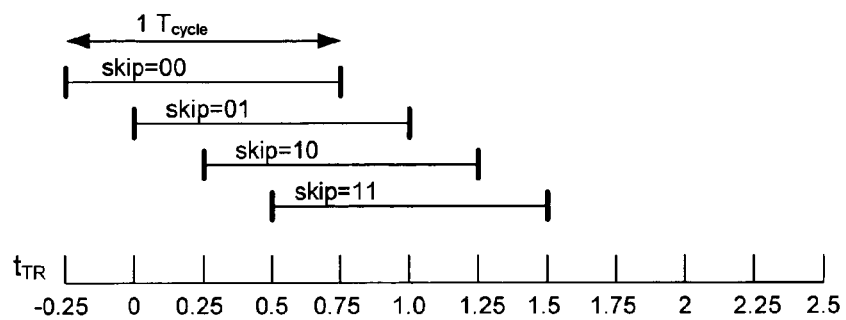
FIG. 22 is a diagram of four-phase ladder tTr.

Another embodiment of the timing synchronizer is shown in FIG. 21, and consists of four overlapping ladders 961/971, 962/972, 963/973 and 964/974. The resultant ladder ranges are shown versus tTR value in FIG. 22. We should note that the ideal overlap between each ladder is ¾ TCYCLE. This allows substantially more margin for errors in ladder shifts, narrowing, and placements of multiplexer 979 select controls. This embodiment divides the synchronization problem into four separate ladders. If this concept is taken further, an arbitrary number of ladders (of two or greater) may be used with the ideal overlap margin being:

$$T_{overlap} = T_{cycle} \frac{num(\text{ladders}) - 1}{num(\text{ladders})}$$

The above equation shows diminishing increase of overlap margin with an increased number of ladders. Also, an increasing number of ladders requires a larger number of multiplexer select controls.

Figure 23:
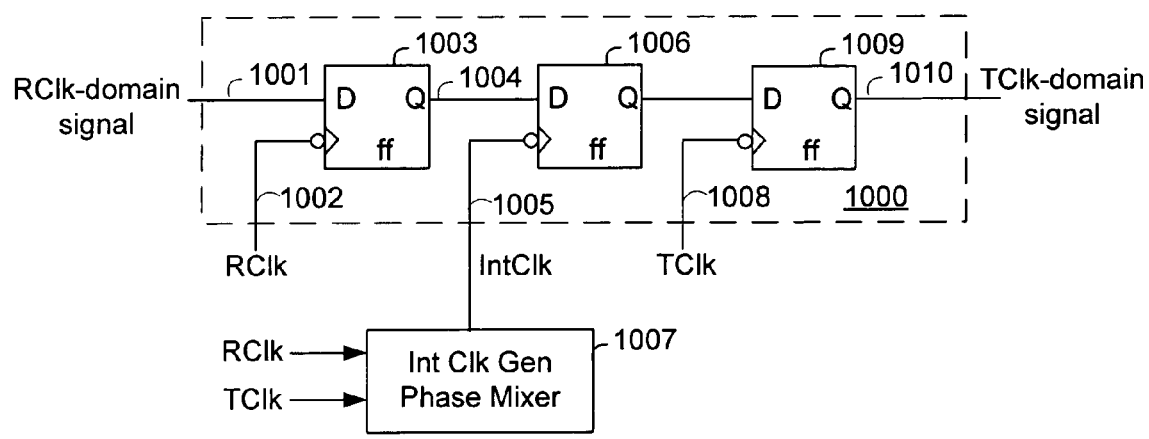
FIG. 23 is a diagram of a blended ladder synchronizer.

A different embodiment of the synchronizer is shown in FIG. 23. This synchronizer realigns the data with the use of a "blended" clock IntClk 1005. The blended clock has a phase which is halfway between RClk and TClk as shown in FIG. 24. The synchronizer includes three sequentially coupled latches 1003, 1006, 1009 that are clocked by RClk 1002, IntClk 1005 and TClk 1008, respectively.

Node 1004 represents RClk valid data, which moves later in phase relative to TClk as tTR increases. This synchronizer circuit preserves the output delay of Data Out/1010 relative to TClk over the entire tTR range of 0 to 1. At tTR=0, the input clocks Rclk and TClk are aligned, and the synchronizer has a three clock cycle delay through the circuit. As tTR increases, and RClk/1002 and Valid Data/1004 lags TClk, the Latency of the synchronizer circuit decreases to compensate for the increased delay of RClk relative to TClk. Therefore, Data Out 1010 is captured by the same TClk edge even as the RClk valid data 1004 is delayed by up to one clock cycle.

The inputs required for this synchronizer are RClk 1002, IntClk 1005, TClk 1008, and RClk-domain Data In 1001. An external multiplexer select generator is not required. In a preferred embodiment, IntClk 1005 is generated by a phase interpolator or mixer circuit 1007.

Detail of Skip Circuit 401

The Skip Circuit 401 (see FIG. 25) is made up of a phase comparator 405, an integrator 404, and a latch 403. The purpose of the Skip Circuit is to generate a very accurate measurement of tTR with minimal-width uncertainty regions. It also provides the capability to latch the output value after initialization, eliminating the possibility of multiple operating latencies if tTR is near a latency-domain boundary.

A preferred embodiment of the phase-comparator in FIG. 27 is used in order to provide an accurate measurement with minimum uncertainty. It contains high-gain narrow-uncertainty-window data receivers of the same type that are used to sample bus data. In the preferred embodiment these are used in conjunction with a DLL or PLL which has aligned RClk so any receiver setup+hold time has been removed. Using a data receiver to sample the external signal TxClk has two advantages over sampling an internal clock. First, it gives the most accurate measurement of bus position as internal clocks can be skewed by clock recovery circuits for a number of reasons. Second, it provides the lowest-jitter source of transmit-domain phase information available. Any clock recovered with a DLL or PLL (e.g. TClk) will necessarily have higher jitter than at the input clock.

In the ideal case, a simple FET (falling-edge-triggered) data receiver could be used to generate the phase-comparator output. However, since clocks traveling at high-speed can undergo duty-cycle distortion, a single-data receiver used in this fashion could incorrectly determine the value of tTR if it was sampling a duty-cycle distorted clock while being clocked by a duty-cycle corrected clock (see FIG. 28). In the case where RClk locks to the falling-edge of its corresponding bus clock, a TxClk duty-cycle 248 less than 50% would cause a FET phase-comparator to falsely put the tTR=0.5 transition at a tTR greater than 0.5. Similarly, if TxClk duty-cycle was greater than 50% 249, the comparator would erroneously put the tTR=0.5 transition at a tTR lower than 0.5. The use of an additional data-receiver 408 in FIG. 27 which is clocked on the rising edge of RClk together with an inverter 412 avoids this problem. Near tTR of 0.5 where a single falling edge triggered receiver would be providing false information due the time shifted rising edge of TxClk, the rising edge of RClk will be near the falling edge of TxClk. By choosing whichever data receiver is closest to sampling the falling-edge of TxClk, using multiplexer 410 and flip-flop 411, the phase comparator can tolerate a non-50% duty-cycle on TxClk. This can be more easily understood by observing the different characteristics of waveforms 248, 249 and 251 at the time of both the RClk rising edge 253 and the RClk falling edge 252. The preferred embodiment of FIG. 27 thus uses flip-flop 411 to make a rough comparison of TClk and Rclk and generate a control signal, SelEven 247, that is used by multiplexer 410 to choose FET receiver 409 for −0.25<tTR<0.25 and RET receiver 408 for 0.25<tTR <0.75. The exact tTR positioning of SelEven is not critical, as in most cases outputs 245 and 246 are identical. The preferred embodiment thus can compare the phase of potentially duty-cycle distorted clocks to duty-cycle corrected clocks and maintain a high degree of accuracy in phase-comparison by only measuring to the falling-edge. In an alternate embodiment, the inverter could be moved and the multiplexer control switched to compare to the rising edge of TxClk with the same effect.

An alternate embodiment of phase-comparator 405 uses a Quadrature Phase Detector to compare RClk and TClk, the Quadrature Phase Detector having output which indicates when the clocks are in quadrature. This eliminates the need for the use of a clock which is in quadrature to TClk, and allows for the combined system to only use two clocks.

The Skip Circuit integrator 404 consists of a standard integrator, which serves to narrow the uncertainty window created by a jitter distribution (such as a Gaussian distribution). Any clock will have a certain amount of random noise which shows up as a distribution of phase. Using an integrator on the output of the phase-comparator ensures that signal 243's transition will be closest to the mean-point of the jitter distributions of both TxClk 220 and RClk 211, while at any single-point in time the raw phase-comparator output 242 could be the result of comparison to an extreme of the clock jitter distributions.

An integrator 404 preferred embodiment shown in FIG. 29 is an analog integrator with steered up and down current sources 416 and 435 into capacitors 417 and 436 which create a differential voltage on output nodes 243 and 270. The steering of these currents is controlled by switches driven by the comparator output 242. In a preferred embodiment, the integrator is allowed to run for at least 40 cycles after the clocks settle, in order to ensure an adequate Gaussian distribution of the clock inputs. After this time, the LatchSkip 219 signal is asserted and de-asserted to both the integrator and the skip latch 403 turning off integration. If the integrator is analog, this signal also asserts a high-gain sense-amp 415. LatchSkip 219 also closes the skip latch 403 so the Skip Circuit output will not change unless LatchSkip 219 is re-asserted.

Detail of Combined Operation of Synchronizer 400 and Skip Circuit 401

The Synchronizer 400 and Skip Circuit 401 make up a synchronization system. Both elements are required in the preferred embodiment in order to properly synchronize data between two mesochronous clock domains. This invention allows for 1) high operating frequency and then 2) low latency while maintaining fail-safe operation.

In order to achieve fail-safe operation, the Synchronizer must not fail to both properly pass and re-time the incoming data. The most significant failure mechanism is if the improper ladder for the current operating conditions (tTR, Voltage, temperature) is used. This can come about due to error sources which this invention minimizes. The multiple possible error sources result in an equation which limits the cycle-time of the system. Possible sources of error include:

1. Error in the absolute placement of the ladder range

This can result in the Skip Circuit choosing the ladder which is closer to its failure point. It can also result in less than optimal ladder overlap regions.

2. Shifting of the ladders due to changes in operating environment (e.g. Vdd, temp)

Ladder shift during operation must be minimized so that the functional ladder range does not pass the current operating tTR.

3. Ladder deadband

Ladder deadband caused by flip-flop setup & hold uncertainty regions directly subtracts from the timing budget for data resynchronization. Clock jitter can also serve to shift the ladder ranges.

4. Skip accuracy

Error in the absolute placement of the skip transition can result in choosing the ladder which is closer to its failure point, similar to #1.

5. Skip uncertainty

A large uncertainty-window in skip means that it is possible that skip will choose the ladder closer to its failure point.

The preferred embodiment of both circuits minimizes each of the possible error sources to provide the maximum fail-safe operating frequency. The sources of error listed above lead to an equation which must be maintained in order to have fail-safe operation. This equation represents the minimum cycle-time limit of the system.

$$\frac{T_{Cycle}}{4} \geq \left(\frac{T_{Setup} + T_{Hold}}{4}\right) + Error_{Ladder} + Error_{Skip} + Movement_{Ladder}$$

The preferred embodiment places the Skip transition at tTR=1. As previously mentioned, the placement of this transition sets the boundary of the first latency domain. In another embodiment, RClk or TxClk/TClk may be shifted earlier or later by a constant time or phase delay so the first latency domain boundary occurs at a tTR other than 1. As both the Synchronizer 400 and the Skip Circuit 401 use RClk as the starting reference both circuits will shift together. All latency domains remain 1 cycle wide, and so all boundary ends will move as well.

An alternate embodiment of this nature that requires no delay elements receives the R-domain data 217 of FIG. 10 with a rising-edge-triggered flip flop instead of falling-edge-triggered flip-flop 306 and the value of skip is inverted from that in the normal embodiment. By making these two changes the circuit moves the first latency domain range to $-0.5 < tTR < 0.5$ and the second range to $0.5 < tTR < 1.5$. This may be done if a coarse adjustment of the domain start and end points is desired.

Thus the combination of the Synchronizer and Skip circuit provide high frequency fail-safe synchronization for mesochronous systems such as that of FIG. 1. Arbitrary phase delays are possible while fail-safe latency is minimized and output latency is kept constant despite changes in the circuit's operating point.

Multiple Operating Frequencies

To accommodate switching between multiple operating frequencies without requiring re-evaluation of skip an alternate embodiment of the Skip circuit 430 can be used as shown in FIG. 26. In this embodiment the single Skip Latch 403 of FIG. 25 has been replaced by multiple skip latches 431-433. In addition, the single LatchSkip signal 219 of FIG. 25 has been replaced by LatchSkip_F1 to LatchSkip_Fn 260-265. There is one latch and one LatchSkip signal for each desired operating frequency.

The operation of this embodiment is as follows. Upon initialization, each of the desired operating frequencies is selected and initialized. During this initialization, after stabilization of the clocks at the new frequency the appropriate LatchSkip_Fx signal is asserted using one of the techniques described previously. After all frequencies have been initialized the correct value for Skip at each desired frequency is stored in the respective skip latches 431-433. The device can then simply select the appropriate Skip value depending on its current operating frequency without having to wait for the Skip Circuit to reevaluate. A multiplexing circuit can connect a selected skip latch to skip input 213 of FIG. 10.

What is claimed is:

1. A synchronizer circuit for passing data from circuitry in a first clock domain clocked by a first clock signal to circuitry in a second clock domain clocked by a second clock signal, the first and second clock signals being mesochronous, comprising:

a domain-crossing circuit including at least two parallel data paths and configured to receive an input data signal from the circuitry in the first clock domain and to output at least two data signals in the second clock domain from respective ones of the at least two parallel data paths;

a phase comparator circuit configured to generate an output based on a phase difference between the first and the second clock signals; and a selecting circuit coupled to receive the at least two data signals and configured to select one of the at least two data signals to pass to the circuitry in the second clock domain based on the output of the phase comparator circuit.

2. The synchronizer circuit of claim 1, wherein the phase comparator circuit includes:

a phase comparator configured to receive the first and second clock signals and a third clock signal in a fixed phase relationship with the second clock signal and to produce an output dependent on the phase difference between the first and second clock signals; and an integrator coupled to the phase comparator and configured to respond to a control signal such that an integration function in the integrator is turned off when the control signal is in a first state and is turned on when the control signal is in a second state.

3. The synchronizer circuit of claim 1, wherein the phase comparator circuit is further configured to store a plurality of skip values each corresponding to a respective one of a plurality of operating frequencies and to select one of the plurality of skip values corresponding to a current operating frequency of the synchronizer circuit as the output to the selecting circuit.

4. The synchronizer circuit of claim 1, wherein the domain-crossing circuit includes:

a sampling circuit configured to sample the input data signal according to the first clock signal;

a first latch circuit in a first one of the at least two parallel data paths and configured to latch an output from the sampling circuit on a first edge of a third clock signal that is in a fixed phase relationship with the second clock signal; and a second latch circuit in a second one of the at least two parallel data paths and configured to latch the output from the sampling circuit on a second edge of the third clock signal, the second edge having an opposite direction of transition relative to the first edge.

5. The synchronizer circuit of claim 4, wherein the output from the sampling circuit is differential.

6. The synchronizer circuit of claim 4, wherein each of the first latch circuit and the second latch circuit includes a precharged sense amp.

7. The synchronizer circuit of claim 4, wherein the third clock signal is in quadrature with the second clock signal and is duty-cycle corrected.

8. The synchronizer circuit of claim 4, wherein the domain-crossing circuit further includes a third latch circuit in one of the at least two parallel data paths and configured to retime an output of the first latch circuit.

9. The synchronizer circuit of claim 1, wherein the domain-crossing circuit includes:
  a first sampling circuit and a first latch circuit in a first one of the at least two parallel data paths, the first sampling circuit configured to sample the input data signal on rising edges of the first clock signal, the first latch circuit configured to latch an output from the first sampling circuit on an edge of a third clock signal that is in a fixed phase relationship with the second clock signal; and
  a second sampling circuit and a second latch circuit in a second one of the at least two parallel data paths, the second sampling circuit configured to sample data in the input data signal on falling edges of the first clock signal, the second latch circuit configured to latch an output from the second sampling circuit on the edge of the third clock signal.

10. The synchronizer circuit of claim 9, wherein the third clock signal is in quadrature with the second clock signal and is duty-cycle corrected.

11. The synchronizer circuit of claim 9, wherein the domain-crossing circuit further includes:
  a third sampling circuit and a third latch circuit in a third one of the at least two parallel data paths, the third sampling circuit configured to sample data in the input data signal on rising edges of a fourth clock signal in a fixed phase relationship with the first clock signal, the third latch circuit configured to latch an output from the third sampling circuit on the edge of the third clock signal; and
  a fourth sampling circuit and a fourth latch circuit in a fourth one of the at least two parallel data paths, the fourth sampling circuit configured to sample data in the input data signal on falling edges of the fourth clock signal, the fourth latch circuit configured to latch an output from the fourth sampling circuit on the edge of the third clock signal.

12. The synchronizer circuit of claim 1, wherein the at least two data signals include data signals in different latency domains when the phase difference between the first and the second clock signals are in certain ranges, and wherein the phase comparator circuit is further configured to freeze its output to avoid changes in latency in an output of the synchronizer circuit.

13. The synchronizer circuit of claim 12, wherein the phase comparator circuit is further configured to receive a control signal, to freeze its output when the control signal is in a first state, and to allow its output to change when the control signal is in a second state.

14. A method of passing data from circuitry in a first clock domain clocked by a first clock signal to circuitry in a second clock domain clocked by a second clock signal, the first and second clock signals being mesochronous, comprising:
  sampling an input data signal from the circuitry in the first clock domain according to the first clock to produce at least one sampled output;
  outputting at least two data signals in the second clock domain from at least two parallel data paths; and
  selecting one of the at least two data signals to be passed to the circuitry in the second clock domain according to a control signal, the control signal being dependent on a phase difference between the first and the second clock signals.

15. The method of claim 14, wherein the at least two data signals include data signals in different latency domains when the phase difference between the first and the second clock signals are in certain ranges, the method further comprising freezing the control signal to avoid a change in latency in an output to the circuitry in the second clock domain.

16. The method of claim 14, further comprising:
  comparing the first and second clocks to generate a phase comparison signal dependent on a phase difference between the first and second clocks;
  integrating the phase comparison signal to produce a phase comparator output signal; and
  latching the phase comparator output signal.

17. The method of claim 14, including storing a plurality of skip values each corresponding to a respective one of a plurality of operating frequencies, and selecting one of the plurality of skip values corresponding to a current operating frequency for use in the selecting operation.

18. The method of claim 14, wherein the outputting operation includes:
  latching in a first one of the at least two parallel data paths the at least one sampled output on a first edge of a third clock signal that is in a fixed phase relationship with the second clock signal; and
  latching in a second one of the at least two parallel data paths the at least one sampled output on a second edge of the third clock signal, the second edge having an opposite direction of transition relative to the first edge.

19. The method of claim 18, wherein the third clock signal is in quadrature with the second clock signal and is duty-cycle corrected.

20. The method of claim 18, wherein the outputting operation further includes retiming a latched signal in one of the at least two parallel data paths.

21. The method of claim 18, wherein the at least one sampled output includes a first sampled output generated by latching the input data signal on a rising edge of the first clock signal and a second sampled output generated by latching the input data signal on a falling edge of the first clock signal, and wherein the outputting operation includes:
  latching in a first one of the at least two parallel data paths the first sampled output on an edge of a third clock signal that is in a fixed phase relationship with the second clock signal; and
  latching in a second one of the at least two parallel data paths the second sampled output on the edge of the third clock signal.

22. The method of claim 21, wherein the at least one sampled output further includes a third sampled output generated by latching the input data signal on a rising edge of a fourth clock signal in a fixed phase relationship with the first clock signal and a fourth sampled output generated by latching the input data signal on a falling edge of the fourth clock signal, and wherein the outputting operation further includes:

latching in a third one of the at least two parallel data paths the third sampled output on the edge of the third clock signal; and latching in a fourth one of the at least two parallel data paths the fourth sampled output on the edge of the third clock signal.

* * * * *